(12) United States Patent (10) Patent No.: US 8,092,908 B2
Ohta et al. (45) Date of Patent: Jan. 10, 2012

(54) GRAPHITE FILM AND GRAPHITE COMPOSITE FILM

(75) Inventors: Yusuke Ohta, Settsu (JP); Shuhei Wakahara, Takatatsu (JP); Yasushi Nishikawa, Osaka (JP)

(73) Assignee: Kaneka Corporation, Osaka-Shi (JP)

( * ) Notice: Subject to any disclaimer, the term of this patent is extended or adjusted under 35 U.S.C. 154(b) by 0 days.

(21) Appl. No.: 12/600,389

(22) PCT Filed: May 15, 2008

(86) PCT No.: PCT/JP2008/058910
§ 371 (c)(1),
(2), (4) Date: Apr. 19, 2010

(87) PCT Pub. No.: WO2008/143120
PCT Pub. Date: Nov. 27, 2008

(65) Prior Publication Data
US 2010/0196716 A1 Aug. 5, 2010

(30) Foreign Application Priority Data
May 17, 2007 (JP) ................................. 2007-132120

(51) Int. Cl.
*B32B 9/00* (2006.01)
*C01B 31/04* (2006.01)
(52) U.S. Cl. ........................................ 428/408; 423/448
(58) Field of Classification Search .................. 423/448; 428/408
See application file for complete search history.

(56) References Cited

U.S. PATENT DOCUMENTS 4,961,991 A * 10/1990 Howard ........................ 428/114
2007/0032589 A1* 2/2007 Nishikawa et al. ........... 524/495

FOREIGN PATENT DOCUMENTS

| JP | 61-275116 A | 12/1986 |
| JP | 11-58591 A | 6/1989 |
| JP | 2-103478 | 4/1990 |
| JP | 04-149014 A | 5/1992 |
| JP | 6-134917 A | 5/1994 |
| JP | 07-109171 A | 4/1995 |

(Continued)

OTHER PUBLICATIONS

International Preliminary Report on Patentability and Written Opinion of the International Searching Authority dated Nov. 24, 2009.

(Continued)

*Primary Examiner* — Daniel C. McCracken
(74) *Attorney, Agent, or Firm* — Marshall, Gerstein & Borun LLP

(57) ABSTRACT

An object of the present invention is to provide a graphite film, and a graphite composite film both having an excellent thermal diffusivity which can sufficiently manage heat dissipation of electronic instruments, precision instruments and the like, along with an excellent flex resistance which can withstand application to bent portions.

Means for Resolution of the present invention is a graphite film exhibiting the number of reciprocal foldings being 10,000 times or more as measured using a rectangular strip test piece having a width of 15 mm until the test piece breaks in a MIT folding endurance test under conditions of: a curvature radius R of the bending clamp being 2 mm; a left-and-right bending angle being 135°; a bending rate being 90 times/min; and a load being 0.98 N.

7 Claims, 26 Drawing Sheets

FOREIGN PATENT DOCUMENTS

| | | |
|---|---|---|
| JP | 08-267647 A | 10/1996 |
| JP | 2000-169125 A | 6/2000 |
| JP | 2000-178016 A | 6/2000 |
| JP | 2001-068608 A | 3/2001 |
| JP | 2002-308611 A | 10/2002 |
| JP | 2003-168882 A | 6/2003 |
| JP | 2004-299919 A | 10/2004 |
| JP | 2004-299937 A | 10/2004 |
| JP | 2005-314168 A | 11/2005 |
| JP | 2007-031237 A | 2/2007 |
| JP | 2008-120668 A | 5/2008 |
| WO | WO 2005/023713 * | 3/2005 |

OTHER PUBLICATIONS

International Search Report in PCT/JP2008/058910 dated Aug. 5, 2008.

* cited by examiner

GRAPHITE FILM AND GRAPHITE COMPOSITE FILM

CROSS-REFERENCE TO RELATED APPLICATIONS

This is the U.S. national phase of International Application No. PCT/JP2008/058910, filed May 15, 2008, which claims the benefit of Japanese patent Application No. 2007-132120, filed May 17, 2007.

TECHNICAL FIELD

The present invention relates to a graphite film for use as a heat spreader material and a radiator film of electronic instruments, precision instruments and the like, and particularly relates to a graphite film that is excellent in flex resistance and thermal diffusivity.

BACKGROUND ART

Cooling issues in semiconductor elements mounted in various electronic/electric instruments such as computers, and in other heat-generating components have been emphasized. As a cooling method of such components which should be cooled, a method including attaching a fan to an instrument housing in which the component is mounted, thereby cooling the instrument housing; a method including attaching a heat conductor such as a heat pipe, a heat spreader, a heat sink or a fin to the component to be cooled, thereby cooling is executed by transferring outward the heat from the element; or the like may be generally employed. Examples of a heat-conducting material attached to a component which should be cooled include aluminum plates, copper plates, and the like. In such a case, a heat-generating component is attached to a part of the aluminum or copper plate, or to the heat pipe, whereby further heat dissipation of other portion of the plate is allowed outside using a fin or a fan.

Meanwhile, downsizing of each instrument into which a heat-generating component such as a semiconductor element is mounted has been performed in recent years, and the amount of heat generation of the member thereof tends to be larger. However, due to downsizing of the housing, the space into which a component such as a fin or a heat sink, a fan and the like can be inserted has been limited.

Thus, graphite films that are excellent in thermal diffusivity have been regarded as a promising heat conductor in recent years. A graphite film has a layered structure formed with carbon, and is a material having a very high thermal conductivity in the face thereof, having a density of the film being approximately 1 to 2 g/cm$^3$, thus being light, and having a high electric conductivity. In addition since the sheet can be thinned in the thickness and is flexible, it is expected as a heat conductor material or a heat spreader material for use in narrow places, or places in which affixing around through gaps is required.

For the present, commonly available graphite films may be exemplified by graphite films manufactured by a polymer thermal degradation method or an expansion method.

The polymer thermal degradation method is, as disclosed in Patent Documents 1 and 2, a method in which a polymer film of polyoxadiazole, polyimide, polyphenylenevinylene, polybenzoimidazole, polybenzooxazole, polythiazole, polyamide or the like is subjected to a heat treatment in an inert atmosphere of argon, helium or the like, or under reduced pressure, whereby a graphite film is obtained.

Patent Document 1: JP-A No. Sho 61-275116
Patent Document 2: JP-A No. He 2-103478

On the other hand, the graphite is obtained by immersing powdery or squamous natural black lead, which is used as a source material, in an acid and thereafter widening the space between the graphite layers by heating, in an expansion method. Additionally, high-pressure press processing is carried out with a caking additive, thereby yielding a filmy graphite.

DISCLOSURE OF THE INVENTION

Problems to be Solved by the Invention

Structures of current electronic instruments become increasingly complex while advances of downsizing of such instruments have made; therefore, the way how to allow the heat to escape efficiently with a small space significantly matters. There are several attempts to use such a graphite film being folded, which is characterized by having flexibility, in a space-saving part. For example, an idea of dissipating the heat from a heat generation part in flip-open mobile phones or laptop computers toward the liquid crystal side through the bent portion has been projected.

However, a fracture is often generated in a graphite film at the bent portion thereof since it is materially fragile, particularly when it is folded with a small curvature radius or with a large bending angle. In particular, although a graphite film obtained by an expansion method has flexibility, it has small graphite crystallite accompanied by inferior crystallinity since it is produced from a powdery or squamous natural black lead as a source material. Therefore, such a graphite film has less thermal diffusivity and less film strength, and is thus more fragile as compared with a graphite obtained by a polymer thermal degradation method. Additionally, although a graphite film obtained by a polymer degradation method (Patent Documents 1 to 2) has flex resistance and thermal diffusivity to some extent, it is not satisfactory as a heat-dissipating material for recent electronic instruments accompanied by advanced downsizing and complexity.

In this regard, Patent Document 3 proposes a method of manufacturing a graphite sheet that exhibits physical properties similar to those of single-crystal graphite, and has a high quality, superior flexibility and toughness, with the thermal diffusivity being excellent. This manufacturing method is fundamentally characterized by including a first heat treatment step carried out using a polyimide film as a source material in an inert gas in the upper limit temperature range of 1,000° C. to 1,600° C.; and a second heat treatment step further carried out in the upper limit temperature range of 2,500° C. to 3,100° C., and further controlling the heat treatment conditions such as a temperature elevation rate, a constant temperature and the like to manufacture a graphite sheet having appropriate properties, which may be subjected further to a rolling treatment, whereby the flexibility is achieved. Furthermore, a method of manufacturing a graphite film is disclosed such as a method as referred to in claim 7 of Patent Document 3 in which provided that the graphite sheet has a density falling within the range of 0.3 to 0.7 g/cc or the graphite sheet has a film thickness falling within the range of two to ten times the film thickness of the source material film, a graphite sheet that is excellent in flexibility and toughness can be obtained when a rolling treatment is carried out as a post-treatment, or as referred to in claim 8 of Patent Document 3 in which provided that the graphite sheet obtained by a rolling treatment has a density falling within the range of 0.7 to 1.5 g/cc, the resulting graphite sheet has excellent flexibility and toughness.
Patent Document 3: JP-A No. 2000-178016
However, even in the case of the graphite film produced by the manufacturing method disclosed in Patent Document 3, the film is likely to be broken when it is bent with a small curvature radius, or with a large bending angle, and sufficient flex resistance for introducing into recent downsized electronic instruments may not be exhibited.

In addition, "flex resistance" and "thermal diffusivity" are contradictory properties. As disclosed in Patent Document 3, the flex resistance can be improved by producing in the film a space to make the graphite layer movable in bending in the graphitization process; however, this space inhibits migration of heat, whereby the thermal diffusivity is reduced. The flex resistance is sought also by the graphite film produced by the manufacturing method of Patent Document 3; therefore, it has inferior heat diffusibility, and cannot deal with the increase in the amount of heat generation in current electronic instruments.

Moreover, a technique of providing a reinforcing material on one face or both two faces of a graphite film to enhance the mechanical strength was proposed. For example, Patent Document 4 discloses an expanded black lead laminate sheet in which a plastic film is overlaid on both two faces of an expanded black lead sheet, and at least a part of the plastic film is welded to be joined to the expanded black lead sheet on these polymerized faces.

Furthermore, Patent Document 5 discloses a heat-conducting sheet, connected by thermal fusion bonding of a plastic tape on at least one face of a graphite film. In addition, as in Patent Document 6, a heat-dissipating sheet is disclosed in which a polymer material layer having lower rigidity than that of the graphite film is provided, whereby deformation without breaking of the graphite film is enabled even though a stress such as bending is caused in the graphite film, since the adjacent polymer material layer absorbs the stress by way of the shear to reduce the stress of the graphite film.
Patent Document 4: JP-A No. Hei 6-134917
Patent Document 5: JP-A No. Hei 11-58591
Patent Document 6: JP-A No. 2003-168882
However, even though deficient strength is compensated with a supporting member such as a plastic tape, the graphite film as disclosed in Patent Documents 1 to 6 cannot exhibit flex resistance sufficient for use in current electronic instruments, when bent with a small curvature radius or with a large bending angle, since only the graphite film is broken although the support itself may not be broken.

Accordingly, several attempts to improve flex resistance of a graphite film have been made; however, properties sufficient for use in mounting in recent electronic instruments have not yet achieved, and thus development of a graphite film having high thermal diffusivity and being excellent in flex resistance has been demanded.

Means for Solving the Problems

A first aspect of the present invention relates to a graphite film characterized by exhibiting the number of reciprocal foldings being 10,000 times or more as measured using a rectangular strip test piece having a width of 15 mm until the test piece breaks in a MIT folding endurance test under conditions of: a curvature radius R of the bending clamp being 2 mm; a left-and-right bending angle being 135 degrees; a bending rate being 90 times/min; and a load being 0.98 N, the graphite film being obtained by subjecting a source material film consisting of a polymer film and/or a carbonized polymer film to a heat treatment at a temperature of 2,000° C. or higher, and the graphite film being characterized by, on an SEM image of the surface at a magnification of 400×, having the area of a white region accounting for not less than 1% and not greater than 8.5% of the image defined by binarization to black and white with a threshold of 160 and further thinning of the white region of the binarized image.

Furthermore, it is preferred that the graphite film be characterized by exhibiting the number of reciprocal foldings being 10,000 times or more as measured using a rectangular strip test piece having a width of 15 mm until the test piece breaks in a MIT folding endurance test under conditions of: a curvature radius R of the bending clamp being 1 mm; a left-and-right bending angle being 135 degrees; a bending rate being 90 times/min; and a load being 0.98 N, and the graphite film has a coefficient of thermal diffusivity in a planer direction of not less than $8.0 \times 10^{-4}$ m$^2$/s.

Moreover, a second aspect of the present invention relates to a graphite composite film characterized in that a plastic film is fowled on a part of any one the graphite film described above via an adhesive material.

Effects of the Invention

A graphite film and a graphite composite film that are excellent in flex resistance and thermal diffusivity are provided.

Figure 1:
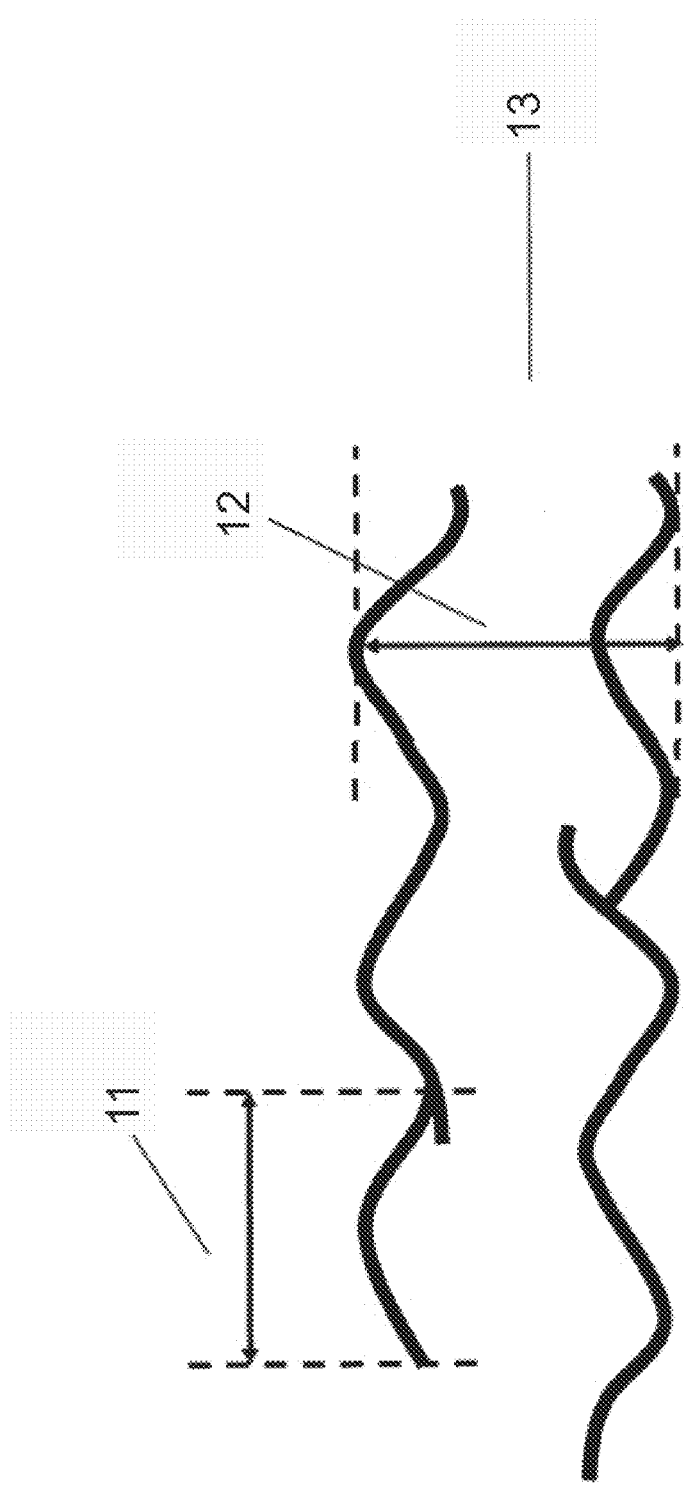
FIG. 1 shows a cross-sectional schematic view of a foamed graphite film.

DESCRIPTION OF REFERENCE NUMERALS AND SIGNS 11 domain size
12 extent of foaming
13 cross-sectional schematic view of a foamed graphite film
21 size of region surrounded by a boundary line
22 boundary line
23 cross-sectional schematic view of a compressed graphite film
71 smooth portion
72 protruding portion
73 edge portion
74 secondary electron
75 specimen
76 diffusive region
81 region separated by a boundary line
82 boundary line
91 SEM image
92 image after binarization
93 image after thinning
1 polyimide film
2 wedge-shaped sheet
3 width of wedge-shaped sheet
4 sodium light
5 interference fringe
121 PET
122 adhesive material
123 graphite film
124 runover by 1 mm
125 side view
126 top view
131 PET
132 adhesive material
133 polyimide film
134 graphite film
135 copper foil
141 silicone rubber sheet
142 heater
143 seam folded portion
144 graphite film
151 vessel A holding the source material film
152 smooth electrically accessible flat plate for holding the source material film
161 vessel B
162 carbon particles filled between vessel A and vessel B
163 carbon particles filled around outer periphery of vessel B

BEST MODE FOR CARRYING OUT THE INVENTION

A first aspect of the present invention is a graphite film characterized by exhibiting the number of reciprocal foldings being 10,000 times or more as measured using a rectangular strip test piece having a width of 15 mm until the test piece breaks in a MIT folding endurance test under conditions of: a curvature radius R of the bending clamp being 2 mm; a left-and-right bending angle being 135 degrees; a bending rate being 90 times/min; and a load being 0.98 N.

Furthermore, a second aspect of the present invention is a graphite film characterized by exhibiting the number of reciprocal foldings being 10,000 times or more as measured using a rectangular strip test piece having a width of 15 mm until the test piece breaks in a MIT folding endurance test under conditions of: a curvature radius R of the bending clamp being 1 mm; a left-and-right bending angle being 135 degrees; a bending rate being 90 times/min; and a load being 0.98 N.

<Graphite Film>

As a countermeasure for dealing with increase in heat generation density in recent electronic instruments, graphite films that are significantly favorable in thermal diffusivity have drawn attention. For the present, there are commonly available graphite films manufactured by a polymer thermal degradation method or an expansion method.

<Manufacturing Method of the Graphite Film of the Present Invention>

According to the method for manufacturing the graphite film of the present invention, a source material film consisting of a polymer film and/or a carbonized polymer film is subjected to a heat treatment at a temperature of 2,000° C. or higher, thereby obtaining a graphite film. It is known that in general, a graphite film obtained by a polymer thermal degradation method in which a source material film is subjected to a heat treatment in an inert atmosphere such as argon or helium, or under reduced pressure is excellent in flex resistance and thermal diffusivity.

Whereas, although a graphite film obtained by an expansion method has flexibility, it is inferior in crystallinity having small graphite crystallite, since it is produced by compacting powdery or squamous natural black lead. Therefore, thus obtained ones are inferior in thermal diffusivity as compared with the graphite obtained by the polymer thermal degradation method, and many have less film strength and are fragile.

<Flex Resistance of Graphite Film>

The number of foldings with a MIT folding endurance test of the graphite film of the present invention (with R being 2 mm, and a left-and-right bending angle being 135°) is 10,000 times or more, preferably 50,000 times or more, and still more preferably 100,000 times or more. When the number of the foldings is 10,000 times or more, excellent flex resistance is achieved, and is less likely to be broken even though it is used in bent portion. Specifically, even though it is used in hinges of mobile phones and bent portions of downsized electronic instruments, use without deteriorating the function is enabled. In addition, due to the excellent flex resistance, handlability in attaching to electronic instruments can be also improved. To the contrary, when the number of foldings is less than 10,000 times, the film is likely to be broken during use in the bent portion due to inferior flex resistance. Additionally, handlability during use may be also wrong. Particularly, when the bending angle is large, and when the bending radius is small, the film is easily deteriorated.

In addition, the number of foldings of the graphite film of the present invention with a MIT folding endurance test (with R being 1 mm, and a left-and-right bending angle being 135°) is 10,000 times or more, preferably 50,000 times or more, and still more preferably 100,000 times or more. When the number of the foldings is 10,000 times or more, excellent flex resistance is achieved, and is less likely to be broken even though it is used in bent portion. Specifically, even though it is used in hinges of mobile phones and bent portions of downsized electronic instruments, use without deteriorating the function is enabled. In addition, due to the excellent flex resistance, handlability in attaching to electronic instruments can be also improved. To the contrary, when the number of foldings is less than 10,000 times, the film is likely to be broken during use in the bent portion due to inferior flex resistance. Additionally, handlability during use may be also wrong. Particularly, when the bending angle is large, and when the bending radius is small, the film is easily deteriorated.

<Bending Radius and Bending Angle in MIT Folding Endurance Test>

The MIT folding endurance test of a graphite film may be measured using a MIT flex resistant fatigue testing machine model D manufactured by TOYO SEIKI Co., Ltd., or the like. In the measurement, the bending radius R and the bending angle can be selected, with the option of R being 2 mm, 1 mm and the like. Generally, the testing conditions will be more severe as the bending radius R is smaller, and as the bending angle is larger. Particularly, in electronic instruments having smaller space such as mobile phones, gaming devices, liquid crystal televisions, PDPs and the like, it is very important to achieve superior foldability with smaller bending radius and larger bending angle since, space-saving designs of the instruments are enabled. It should be noted that details of the MIT test process are described in EXAMPLES below.

<Mechanism for Graphite Film Production Excellent in Flex Resistance>

The graphite film that is excellent in the flex resistance is obtained by elevating the temperature of a polymer film such as a polyimide film to 2,600° C. or higher. In a final stage of graphitization (2,600° C. or higher), the graphite layer is raised by an internal gas generated such as $N_2$, whereby the film is foamed (irregularity resulting from the foaming being observed on the surface as shown in FIG. 1). Thus foamed graphite film is subjected to pressing or rolling, whereby a graphite film that is excellent in the flex resistance is produced. The foamed graphite film is excellent in the flex resistance on the ground that the strain of the graphite layer applied in folding can be relieved due to the presence of the air layer between the layers of the graphite.

<Extent of Foaming and Flex Resistance>

However, all thus foamed graphite films are not necessarily excellent in the flex resistance. Depending on the graphitization conditions, the size of foaming in the thickness direction of the graphite film (hereinafter, referred to as extent of foaming) varies, and the extent of foaming is the primary factor that decides whether the flex resistance is superior or inferior. When the extent of foaming is too small, the amount of the air layer that exists between the graphite layers is insufficient, and thus a film that is hard and inferior in the flex resistance is yielded since the strain of the graphite layer cannot be relieved in bending. In addition, a graphite film that is inferior in the flex resistance is yielded also in the case in which the extent of foaming is too large, as the graphite layer is likely to be detached from the surface in folding since the graphite layer is broken for foaming. In FIG. 1, a part indicating the extent of foaming is shown in the schematic view of a cross section of a graphite film.

<Domain Size and Flex Resistance>

Moreover, the size of each one irregularity in the planer direction (domain size) determined on the graphite surface in the foaming state also varies depending on the conditions of graphitization, and this domain size is also one factor that that decides whether the flex resistance is superior or inferior. When the domain size is too large, a hard film is yielded as the flex resistance is inferior and hence it cannot stand the folding. In addition, when the domain size is too small, each one domain is likely to be detached in folding, thereby resulting in a graphite film having inferior flex resistance.

As described in the foregoing, it is necessary to optimize the graphitization conditions to produce an appropriate foaming state for the purpose of providing a graphite having a high flex resistance.

<Boundary Line on the Surface of Graphite Film after Compression>

Figure 2:
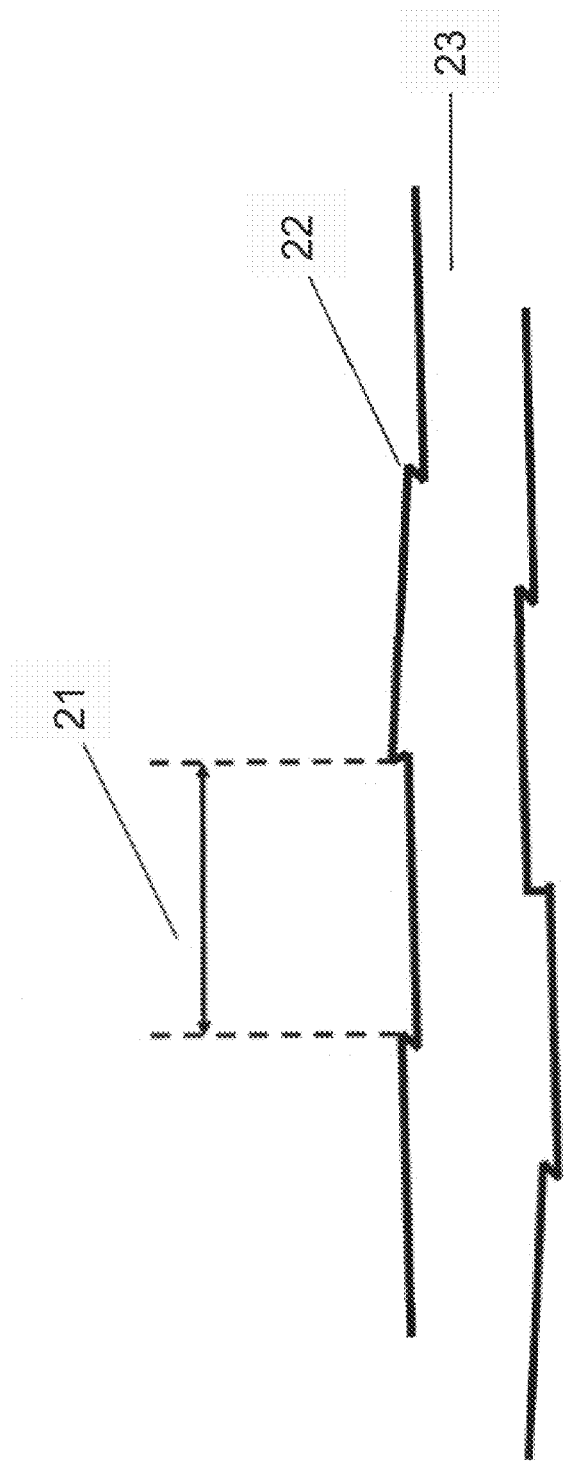
FIG. 2 shows a cross-sectional schematic view of a compressed graphite film.

As described above, irregularities can be observed on the surface of the graphite film after foaming as shown in FIG. 1. When a compression processing such as pressing or rolling is carried out, these irregularities collapse, and the graphite layers overlap on the boundaries of the irregularities, whereby the boundary line as in the schematic view shown in FIG. 2 is generated.

<Relationship Between Foaming State of Graphite Film and Boundary Line on the Surface>

When the extent of foaming is large, or when the foaming domain size is small, many boundary lines are generated on the surface after the compression processing. To the contrary, when the extent of foaming is small, or when the foaming domain size is large, boundary lines are less likely to be generated on the surface after the compression processing. Therefore, by determining the amount of the boundary lines on the surface of the graphite film after the compression processing, the foaming state of the graphite film can be identified, and thus the flex resistance can be presumed as to whether it is superior or inferior.

Figure 3:
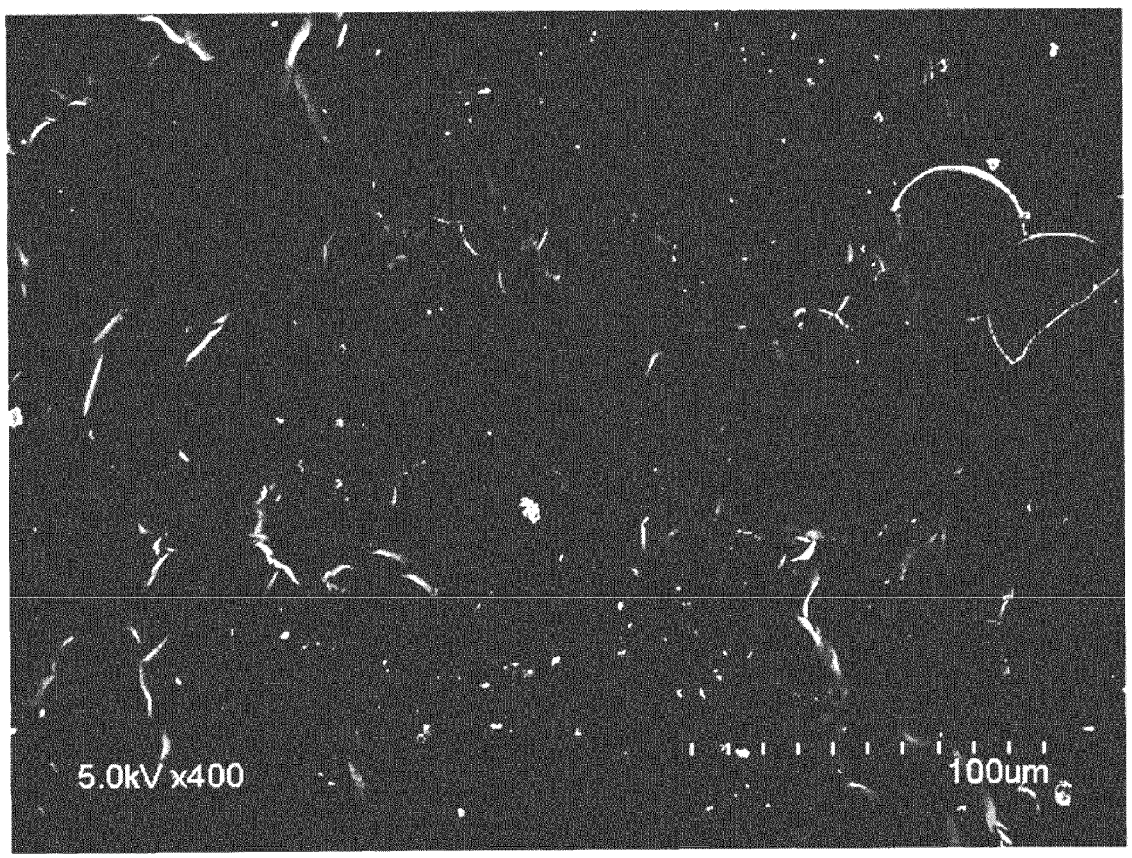
FIG. 3 shows an SEM photograph of a foamed graphite film (large extent of foaming, small domain)
Figure 4:
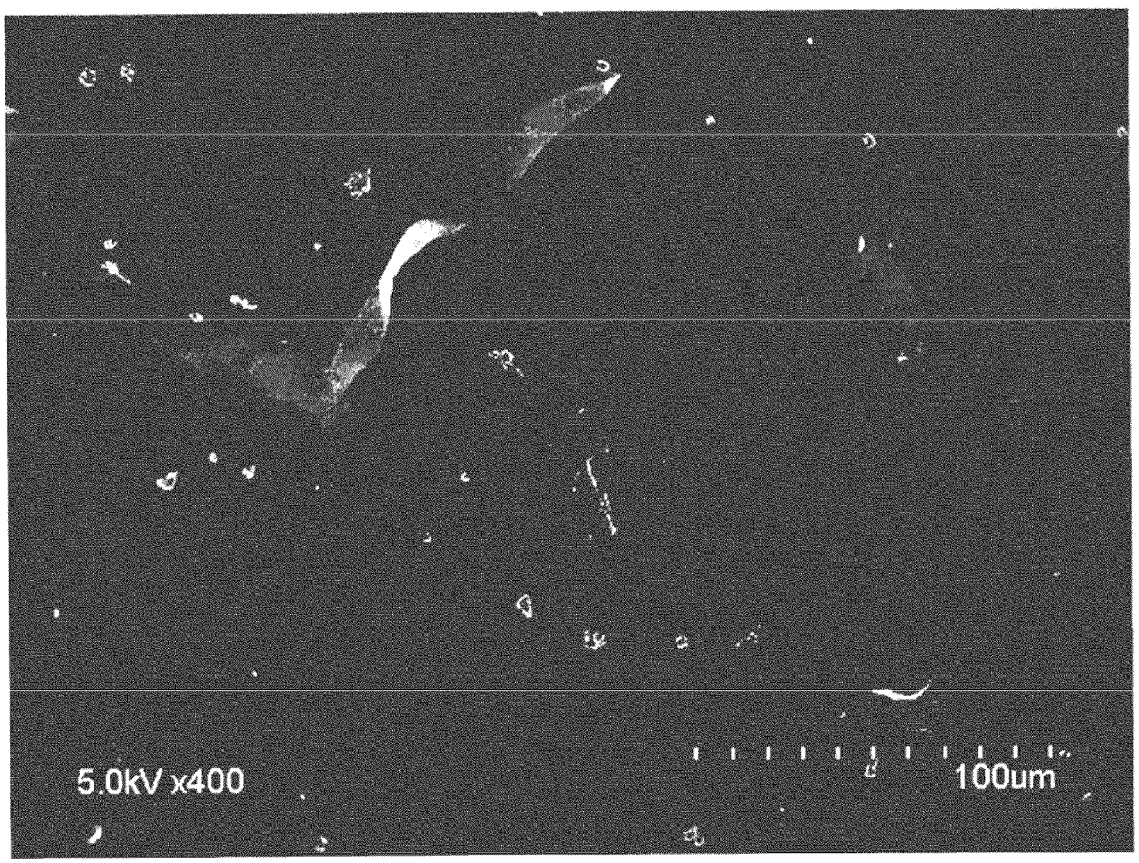
FIG. 4 shows an SEM photograph of a foamed graphite film (small extent of foaming, large domain)
Figure 5:
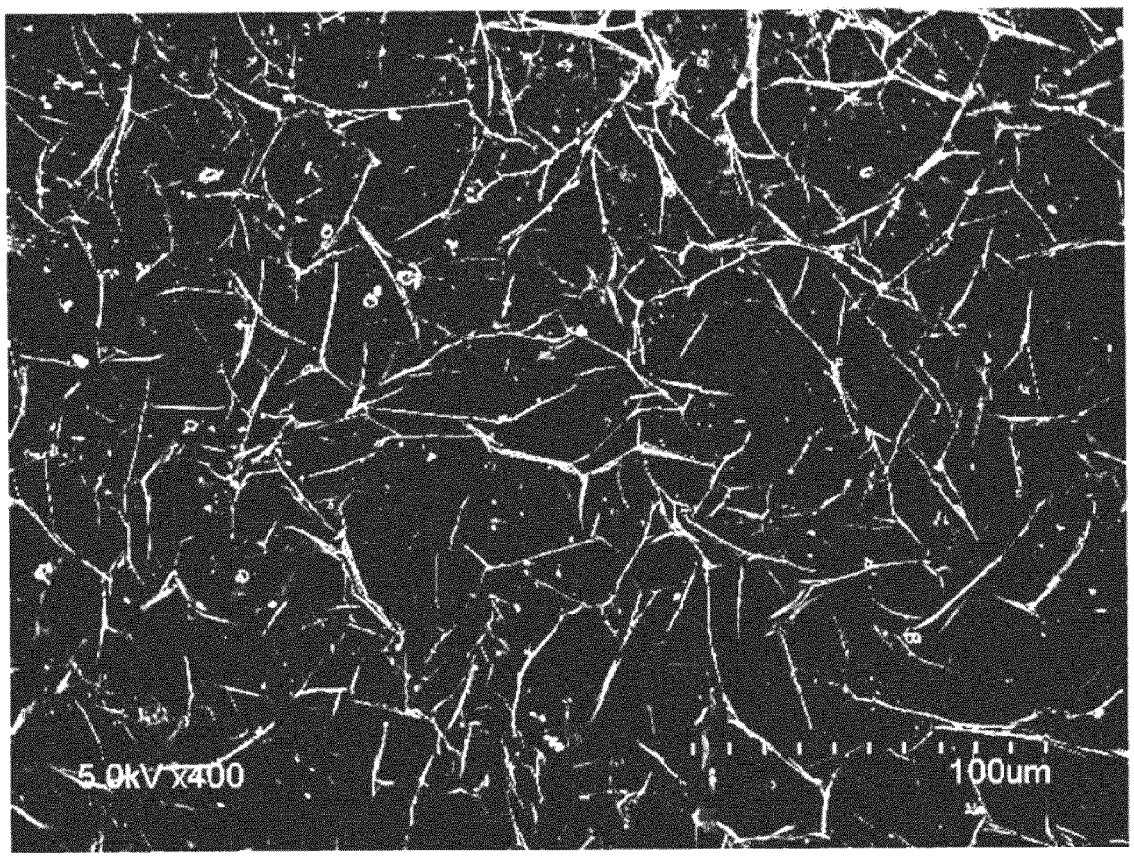
FIG. 5 shows an SEM photograph of a compressed graphite film (large extent of foaming, small domain)
Figure 6:
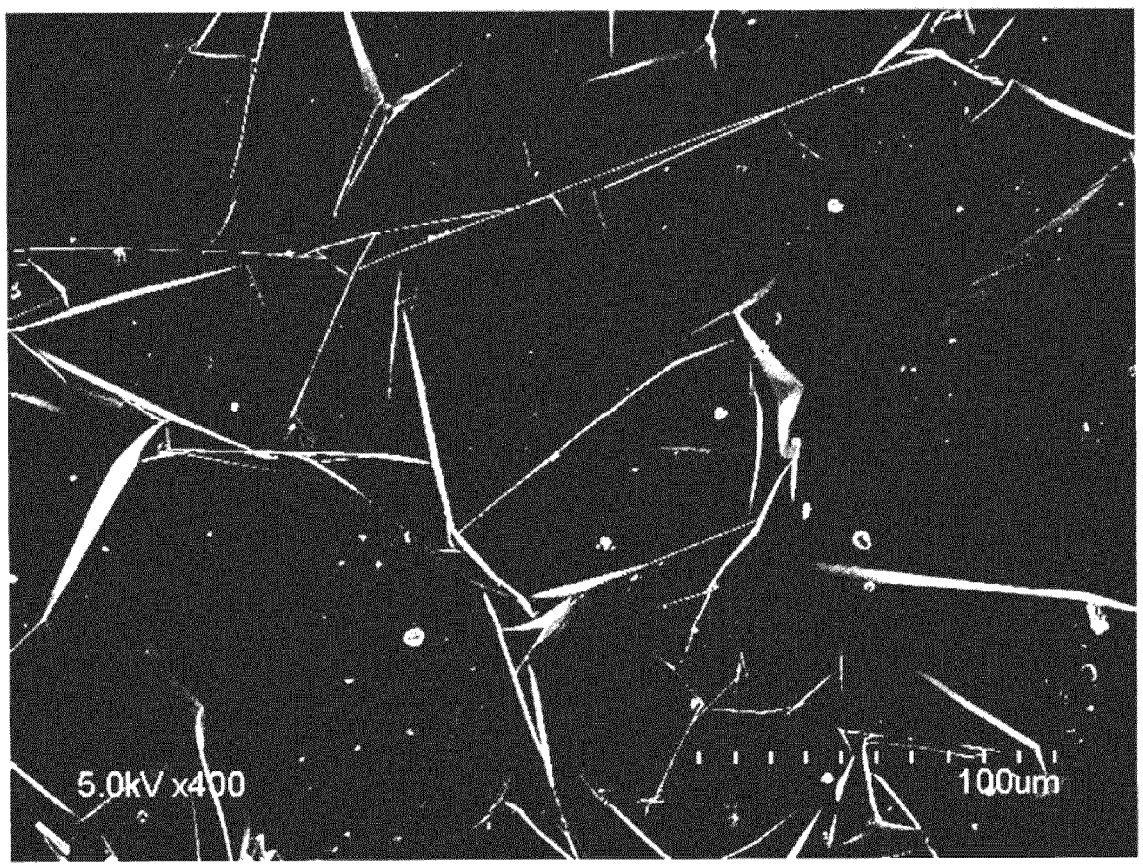
FIG. 6 shows an SEM photograph of a compressed graphite film (small extent of foaming, large domain)

By way of examples, FIGS. 3 and 4 show SEM photographs of graphite films having different foaming states. FIG. 3 shows the extent of foaming being larger, while the domain size being smaller. When the graphite films shown in FIGS. 3 and 4 are compressed, the irregularities of the foaming are collapsed, and the boundary lines are generated on the surface as shown in FIGS. 5 and 6. FIG. 5 shows a graphite film having a larger extent of foaming, and a smaller domain size compressed, revealing a large amount of generation of boundary lines, while FIG. 6 shows a graphite film having a smaller extent of foaming, and a larger domain size, revealing a small amount of generation of boundary lines.

<Observation of Boundary Line on Graphite Surface by SEM Inspection>

The boundary line of a graphite film on the surface can be observed by SEM inspection. When an SEM inspection is carried out on a graphite surface, the part of the boundary line looks bright as shown in FIGS. 5 and 6.

Figure 7:
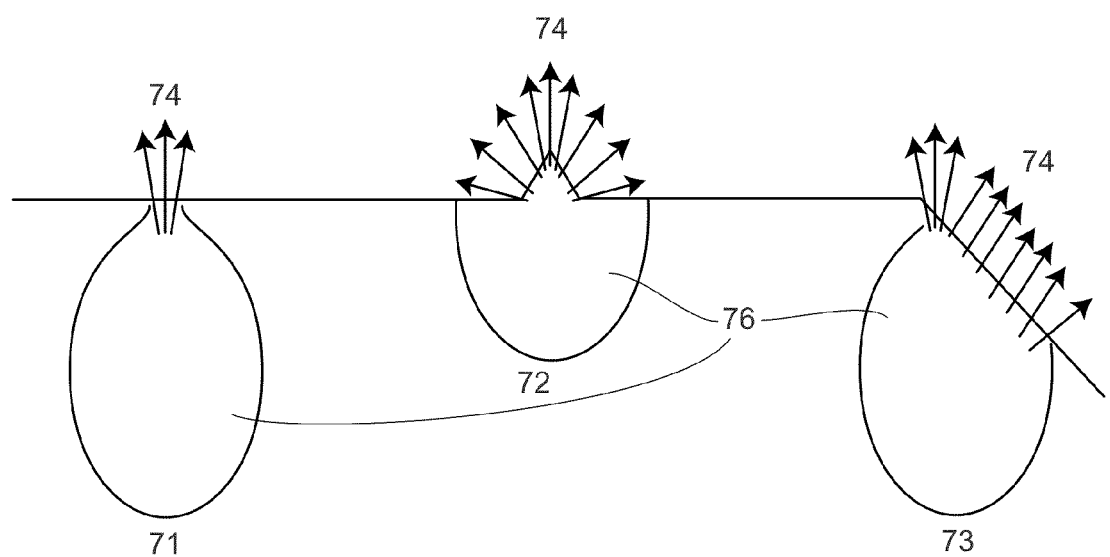
FIG. 7 shows an explanatory view of an edge effect.

The principle for such observation looking bright at the part of the boundary line is referred to as an edge effect, in which a large quantity of secondary electrons are emitted from the corners of the specimen surface or the projection tip, and thus such parts become enormously blighter compared to other parts, in a secondary electron image as shown in FIG. 7.

<Details of SEM Inspection of Graphite Film Surface>

The observation of the surface of a graphite film was carried out using a scanning electron microscope (SEM) (product name: manufactured by Hitachi, model S-4500) at an accelerating voltage of 5 kV. Several kinds of graphite films were cut into pieces of 5 mm×5 mm, and fixed on an aluminum stage having a diameter of 15 mm with an electrically conductive tape. The stage is regulated and set to give a height of 36 mm. The accelerating voltage was regulated to be 5 eV, and observation with a high magnification mode at 400× was carried out. The working distance was regulated to be 8 mm, and then the brightness, the contrast and the focus were adjusted. Thus, photographing was carried out such that the wrinkle of the graphite film surface can be observed. The image was captured at 640×480.

<Size of Region Separated by Boundary Line of the Graphite Film of the Present Invention>

Figure 8:
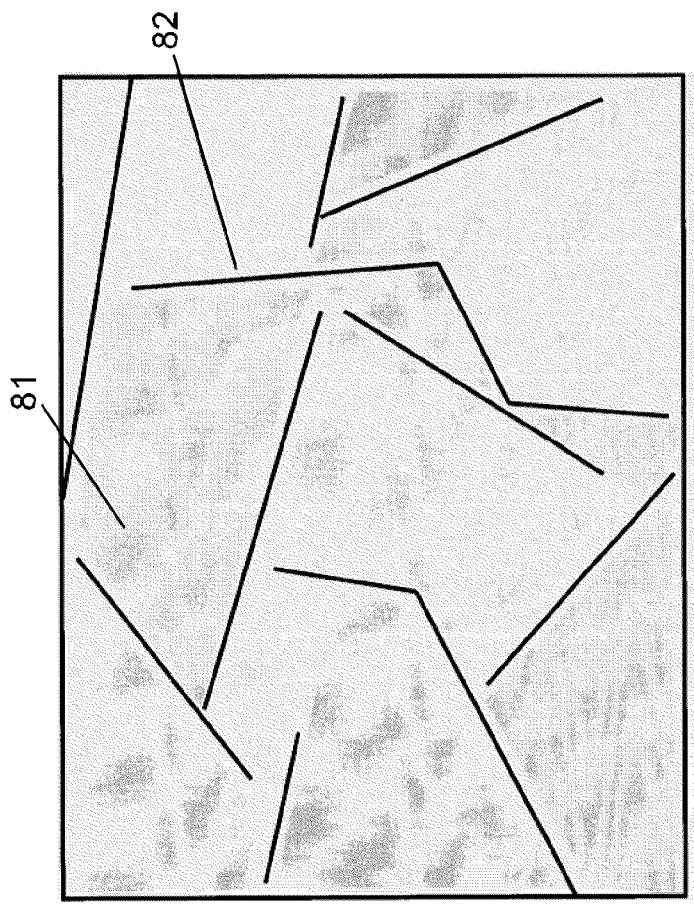
FIG. 8 shows an explanatory view of the region separated by a boundary line.

The mean area of the region separated by the boundary line of the graphite film of the present invention is not less than 25 $\mu m^2$ and not greater than 10,000 $\mu m^2$, preferably not less than 100 $\mu m^2$ and not greater than 6,400 $\mu m^2$, and more preferably not less than 200 $\mu m^2$ and not greater than 3,600 $\mu m^2$. When the area is less than 25 $\mu m^2$, detachment of the graphite layer is likely to be generated in folding, and hence the flex resistance is inferior. Further, when the area is greater than 10,000 $\mu m^2$, the flex resistance becomes inferior since strain of the graphite layer cannot be relieved in bending, and a hard film is provided. To the contrary, when the area is not less than 25 $\mu m^2$ and not greater than 10,000 $\mu m^2$, a graphite film that is excellent in the flex resistance can be provided. It should be noted that the region separated by a boundary line is deemed as being separated provided that 75% or more of the periphery of the region is separated as shown in FIG. 8.

<Image Processing of SEM Inspection Image on Graphite Film Surface>

Image processing of the image obtained by SEM inspection of the graphite film surface was carried out using a general-purpose image processing soft (product name: NANO HUNTER NS2K-PRO/LT) available from NANO System Corporation. With respect to details of the image processing, the SEM image was first incorporated into the image processing program, and the density measurement was carried out. The maximum value (maximum: 255) and the minimum value (0) measured with the density measurement were confirmed, and the threshold of the binarization was determined according to the following formula.

$$\text{Threshold} = (\text{maximum value} - \text{minimum value}) \times 0.62 \quad (1)$$

Next, the SEM image was binarized with the threshold determined according to the above formula. The binarization is a processing in which a region revealing brighter than a certain threshold is whitened, while a region revealing darker than a certain threshold is blackened.

Subsequently, the binarized image was thinned. In the thinning processing, the whitened portion in the binarized image is converted in a line width of 1.

Figure 9:
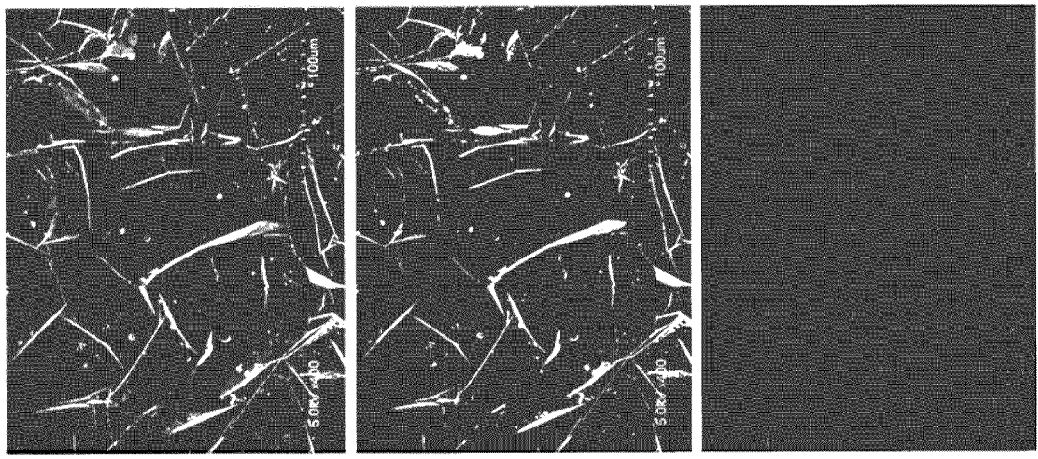
FIG. 9 shows an explanatory view of an image processing.

The area of the white region of the image derived by the processing as described above was measured. As an example, an SEM photograph and the image following carrying out the image processing are shown in FIG. 9.

<Surface State of the Graphite Film of the Present Invention>

The area of the white region of the graphite film of the present invention following carrying out the image processing after the SEM inspection at a magnification of 400× accounts for not less than 1.0% and not greater than 8.5%, preferably not less than 1.2 and not greater than 6.5%, and more preferably not less than 1.4% and not greater than 4.2%. When the area of the white region accounts for less than 1.0%, the boundary line of the graphite film surface appears in a small amount, suggesting that the graphite film is inferior in the flex resistance. Further, when the area of the white region accounts for greater than 8.5%, the boundary line appears in a too large amount, meaning that the graphite film is inferior in the flex resistance as the graphite layer is likely to be fallen off from the graphite surface due to folding operations. To the contrary, when the area of the white region accounts for not less than 1.0% and not greater than 8.5%, each one region separated by the boundary line is large to some extent, meaning that the graphite film is excellent in the flex resistance.

<Method for Manufacturing the Graphite Film of the Present Invention>

In the graphite film according to the present invention, appropriate spaces that make the graphite layers movable upon bending are produced inside the film by a graphitization process. Specifically, the source material film is subjected to a heat treatment at 2,400° C. or higher, and foaming is permitted between the graphite layers utilizing generation of a nitrogen gas remaining in the source material.

As described above, it is important to optimize the foaming state which is one factor that decides the flex resistance and thermal diffusivity of a graphite film. By observing the boundary line of the graphite film surface as described above, the flex resistance and thermal diffusivity of a graphite film can be predicted.

Factors that control the foaming state of a graphite film (extent of foaming, domain size) include:

(1) the heating method in graphitization;
(2) the maximum temperature in graphitization;
(3) the number of laminated pieces of the source material film;
(4) the pressure applied to the film in graphitization;
(5) the molecular orientation of the source material film;

and the like, and the details are explained below. For the optimization of the foaming state, it is important that these factors are well balanced, respectively, and the above five conditions should be altered ad libitum. When the above five factors are combined with favorable balance, thereby enabling the extent of foaming, domain size and the like to be produced, a graphite film that is very excellent in the flex resistance and thermal diffusivity can be obtained.

<Carbonization Step and Graphitization Step>

The graphitization step of the present invention may be either carried out taking the polymer film carbonized by the carbonization step out from the furnace for the carbonization once and thereafter displacing the same into a furnace for graphitization, or may be carried out in the same furnace by carrying out the carbonization step, and the graphitization step successively.

<Heating Method for Graphitization>

Conventionally, atmospheric heating carried out under reduced pressure or in an inert gas has been known as a graphitization step. In the atmospheric heating method, a voltage is applied to a heater made from black lead to allow for heating. The heat generated from the heater is transferred to the specimen by way of radiation, and convection of the inert gas. As the inert gas used in the atmospheric heating method, argon and helium are suited.

In addition, as a method for producing a high quality graphite film, an electric heating method has been known. In the electric heating method, a voltage is applied to the specimen to be the subject of heating, or a vessel per se in which the specimen is packed, thereby carrying out direct heating.

<Atmospheric Heating Method>

In common heat treatment methods in an atmosphere and under reduced pressure conventionally employed, heating is carried out with heat transfer of the atmosphere gas and/or a radiation heat from the heater, or heat transfer form the portion that is in contact with the heater. Thus, uneven heating of a film proceeds by the heat transfer basically from the film surface inwardly; therefore, partial fluctuation may occur in growth of the graphite layer; adverse effects due to the decomposed gas generated during the graphitization may be exerted; or partial defects are likely to be generated during rearrangement of the crystals. Accordingly, formation of a graphite film having nonuniform domain size and extent of foaming has been obliged. Therefore, a graphite film that is inferior in the flex resistance and thermal diffusivity has been often obtained.

One cause for yielding such a graphite film having nonuniform domain size and extent of foaming is spacing between the graphite layers that occurs when the element other than carbon included in the starting source material is gasified and escaped. In the case in which this operation is carried out under a reduced-pressure atmosphere, the gas is generated rapidly from the film due to the reduced pressure, whereby graphite layers are exfoliated to cause detachment of the graphite, which may lead to deterioration of the appearance. In addition, such events can break bonds of the graphite in the planer direction, whereby lowering of the flex resistance and thermal conductivity may be caused.

<Electric Heating Method>

On the other hand, the electric heating method is preferably executed by an "electric heating" system in which a polymer film and/or a carbonized polymer film is brought into direct contact with and held in an electrically accessible vessel (direct electrification vessel), and graphitization is allowed while electrification by applying to the vessel a counter current voltage and/or a direct current voltage. In this system, concomitant with permitting heat generation of the vessel itself, heating through electrification is carried out by applying a voltage to the source material film as a consequence; therefore, heat generation of the source material film itself is contributory. In other words, to carry out the graphitization step by an electrification system is advantageous since the film is heated by two means, i.e., direct heat transfer from the heat-generating vessel, and self heat generation of the film; therefore, the film is heated evenly both inside and on the surface, and also heated from around the film evenly enough, whereby an appropriate foaming state is achieved as homogeneous graphitization proceeds both on the surface and the inside, as a consequence.

Moreover, since the graphite layers evenly grow in the face of the graphite film obtained via a graphitization step by an electric heating system, the resultant graphite film is more likely to have favorable density and coefficient of thermal diffusivity, as well as flatness without flaw, wrinkle and dint even though the film is subjected to a rolling treatment or a compression treatment, and also the film is more excellent in the flex resistance and thermal diffusivity than conventional ones.

<Method for Treatment of Electric Heating>

As the graphitization step by electric heating according to the present invention, for example, a method in which a source material film is held in a black lead vessel, and a voltage is applied to this black lead vessel itself to permit electrification; a method in which a source material film is held in a black lead vessel, which black lead vessel is covered by (filled with) carbon powders around the outer periphery, and a voltage is applied to this black lead vessel itself to permit electrification via the carbon powders; a method in which a source material film covered by carbon powders is held in a black lead vessel (held in a state in which carbon powders are filled between the black lead vessel and the source material film), and a voltage is applied to this black lead vessel itself to permit electrification; a method in which a source material film covered by carbon powders is held in a black lead vessel (held in a state in which carbon powders are filled between the black lead vessel and the source material film), which black lead vessel is further covered by carbon powders (in a state in which carbon powders are filled around the outer periphery of the black lead vessel), and a voltage is applied to this black lead vessel itself to permit electrification via the carbon powders; and the like may be conceived.

<Maximum Temperature of Graphitization>

When the maximum temperature of graphitization is low, the degree of progress of the graphitization, the extent of foaming, and the degree of growth of the domain all become small. In the method for manufacturing the graphite film of the present invention, the heat treatment temperature of 2,000° C. or higher is necessary at lowest and finally 2,800° C. or higher, more preferably 2,900° C. or higher and finally preferably 3,000° C. or higher. By thus setting a heat treatment temperature, the graphite layers grow in the planer direction to allow the growth with a large domain size, whereby a graphite film that is excellent in the flex resistance and thermal diffusivity is obtained. To the contrary, when the maximum temperature of graphitization is lower than 2,800° C., graphitization may not proceed enough in a part of the film. When the graphitization does not proceed enough, the graphite film will be hard, and inferior in the flex resistance and thermal diffusivity since insufficient extent of foaming is attained.

As the heat treatment temperature is higher, transformation into a higher quality graphite is enabled, the temperature is preferably as low as possible in view of the economical efficiency. In the method for manufacturing the graphite film of the present invention, the heat treatment temperature is no higher than 3,500° C. at highest, more preferably no higher than 3,200° C., and still more preferably no higher than 3,100° C. In industrial furnaces which are generally available for the present, the maximum temperature which can be employed in a heat treatment is limited to 3,000° C.

<Number of Laminated Pieces of Source Material Film>

The film is heated in an even manner both inside and on the surface, and also heated from around the film evenly enough according to the electric heating as described above; therefore, it is advantageous in that appropriate foaming state is achieved as a result, due to the homogeneous graphitization both on the surface and the inside. However, when the source material film is heated too evenly, a graphite film with very small extent of foaming, and having too large domain may be obtained. In such a graphite film, since graphite layers are very highly oriented in the planer direction, a graphite film that is very inferior in the flex resistance is likely to be obtained due to failure in corresponding to the strain of the graphite layer generated in folding, although a high heat conductivity may be achieved.

In addition, as described above, the source material film and/or the black lead vessel are covered by carbon particles during the heat treatment according to the electric heating as described above, and thus film foaming in graphitization may be suppressed during the heat treatment due to impurities such as metals invaded from the outside, the black lead vessel and the carbon particles, as well as gasses from the outside. Since the film in which foaming is suppressed has graphite layers very highly oriented in the planer direction, a graphite film that is very poor in the flex resistance is likely to be obtained due to failure in corresponding to the strain of the graphite layer generated in folding, although a high heat conductivity may be achieved.

In order to solve the problems as described in the foregoing, graphitization is carried out in the graphitization step according to the present invention, in a state of the source material films being laminated. The number of the laminated pieces is not less than 10, preferably not less than 30, and more preferably not less than 50.

By laminating the source material films, heterogeneity in progress of the graphitization may occur to some extent as compared with the case in which a single piece of the source material film alone is used, since the proportion of the source material film occupying the vessel is elevated. Owing to this heterogeneity, a graphite film having an adequate extent of foaming and an adequate domain size can be obtained. Such a graphite film is very excellent in the flex resistance and thermal diffusivity.

Moreover, the source material film and/or the black lead vessel is covered by the carbon particles during the heat treatment as described above in the electric heating, and thus erosion and deterioration may be caused during the heat treatment due to impurities such as metals invaded from the outside, the black lead vessel and the carbon particles, as well as gasses from the outside. When a source material film laminate in which a plurality of pieces of the source material films are laminated is used as the source material film as in the present invention, the source material film is in a closed contact state. Therefore, it becomes hardly affected by impurities invaded from the outside, whereby a graphite film that is excellent in the flex resistance and thermal diffusivity can be produced in large quantities.

Furthermore, when a source material film laminate in which a plurality of pieces of the source material films are laminated is used as the source material film as in the present invention, the source material film is in a closed contact state, thereby allowing the gas to be less likely to be escaped; therefore, retardation of timing of generation of the gas is enabled until reaching to a temperature region to result in development of the graphite layers. As a consequence, since foaming is carried out in the state after reaching to a planer state without deteriorating the graphite layer, a graphite film having an adequate extent of foaming and an adequate domain size is obtained. To the contrary, when a single film without lamination of the source material films as conventional products is used as a starting source material, a state in which the gas is likely to be escaped from both faces of the film; therefore, the gas is likely to be escaped prior to formation of the graphite layer, whereby widening of the space between graphite layers may be difficult.

When a source material film laminate in which a plurality of pieces of the source material films are laminated is used as the source material film as in the present invention, the source material film serves as a buffering material in escaping the gas. Therefore, the force applied to the source material film upon deformation during heating can be reduced, and thus the bonds of the graphite layers are not broken. Consequently, excellent flex resistance and thermal diffusivity can be realized.

To the contrary, when a simplicial film in which source material films are not laminated is used as the source material film as in conventional cases, it is necessary to sandwich the source material film with a graphite plate, a spacer such as a graphite film, a carbon plate or a carbon film. In such a case, the flex resistance and thermal diffusivity may be deteriorated since the generated gas may be prevented from escaping due to pressure by the spacer, and the bonds of the graphite layers are broken.

By carrying out graphitization with the laminated source material film in such a manner, a graphite film that is excellent in the flex resistance and thermal diffusivity can be obtained. However, the number of the laminated pieces of the source material film illustrated herein is merely one example, and is not limited thereto, which may be determined ad libitum depending on the heating method of graphitization and the maximum temperature of graphitization described above, and the pressure applied to the film upon graphitization and the orientation of the source material film described later.

<Pressure Applied to Film in Graphitization>

When the film is significantly compressed in the graphitization, the compression leads to physical orientation of the graphite layers in the planer direction, whereby a graphite film having a small extent of foaming and a large domain size is likely to be obtained. To the contrary, when the film is poorly compressed in graphitization, a nonuniform graphite film having a large extent of foaming and a small domain size is likely to be obtained.

The pressure applied to the source material film in the thickness direction in the present invention may be not less than $5.0$ g/cm$^2$, and more preferably not greater than $100$ g/cm$^2$. In graphitization of the source material film, a process in which the size of the source material film is expanded and/or shrunk is included. When graphitization is carried out under the pressure being less than $5.0$ g/cm$^2$, expansion and/or shrinkage of the nonuniform film accompanying to graphitization of the source material film may occur, and thus homogeneous graphitization is not achieved in the film face, thereby resulting in a graphite film having a large extent of foaming, nonuniform domain size and inferior flex resistance.

To the contrary, when the pressure is not less than $5.0$ g/cm$^2$ and not greater than $100$ g/cm$^2$, when the polyimide film and/or carbonized polyimide film as described later is particularly used as a source material film, a graphite film that is excellent in the heat conductivity could be obtained. This is presumed to result from acceleration of development of the graphite crystal structure in the planer direction of the film accompanying to graphitization in the graphitization step, as the graphitization was carried out while applying a pressure in the thickness direction of the source material film.

In addition, when the pressure is higher than $100$ g/cm$^2$, development of the graphite crystal structure in the planer direction may be excessively accelerated, whereby a graphite having very small extent of foaming, and a very large domain size is obtained. The aforementioned pressure is calculated with respect to the area of the graphite film obtained following the heat treatment.

In the graphitization step, the way for achieving application of a pressure to the source material film in the film thickness direction may involve: the own weight of a jig used in holding the film; a pressure from a lid in the case in which the lid is used for the vessel for holding the film; expansion of the vessel around the film due to heating; and a pressure resulting from the expansion of the jig used in holding the film, but is not limited thereto.

Moreover, with respect to an appropriate pressure applied to the film in graphitization, the heating method of graphitization and the maximum temperature of graphitization described above, and the number of the laminated pieces of the source material film and the orientation of the source material film described later may be determined ad libitum, but not limited thereto. For example, when the number of the laminated pieces is large, it is necessary to increase the applied pressure so as to lessen the extent of foaming, since the heating is likely to be uneven, and the extent of foaming tends to be great as described above. To the contrary, when the number of the laminated pieces is small, the applied pressure may be small.

<Source Material Film>

The source material film which can be used in the present invention is a polymer film or a carbonized polymer film.

<Polymer Film>

The polymer film which can be used in the present invention is not particularly limited, but is exemplified by polyimide (PI), polyamide (PA), polyoxadiazole (POD), polybenzooxazole (PBO), polybenzobisoxazole (PBBO), polythiazole (PT), polybenzothiazole (PBT), polybenzobisthiazole (PBBT), polyparaphenylenevinylene (PPV), polybenzoimidazole (PBI) and polybenzobisimidazole (PBBI), and the polymer film is preferably a heat resistant aromatic polymer film including at least one selected from these, since the flex resistance and thermal diffusivity of the graphite finally obtained can be large. These films may be manufactured by a well-known manufacturing method. Of these, polyimide is preferred since the film having a variety of structures and properties can be obtained by selecting the source material monomer variously. In addition, polyimide films are likely to lead to a graphite having superior crystallinity and being excellent in the flex resistance and thermal diffusivity, since carbonization and graphitization of the film proceed more easily than polymer films produced using other organic material as a source material.

<Carbonized Polymer Film>

The carbonized polymer film used in the present invention is preferably obtained by subjecting a polymer film used as a starting substance to a preheating treatment under reduced pressure or in an inert gas. It is desired that this preheating is carried out at a temperature of usually 1,000° C., for example, when the temperature is elevated at a rate of 10° C./min, the temperature is kept in the temperature region of 1,000° C. for 30 min. More specifically, carbonization temperature for carbonizing the polymer film may be 600° C. or higher and lower than 2,000° C. Thus, a carbonized polymer film used as an example of the source material film according to the present invention is preferably a carbonized polymer film obtained by subjecting a polymer film to a heat treatment at a temperature of 600 to 1,800° C. The temperature of the heat treatment temperature is preferably 1,000° C. or higher, more preferably 1,100° C. or higher, still more preferably 1,200° C. or higher, and particularly preferably 1,400° C. or higher. The temperature of carbonization is preferably lower than 2,000° C. on the ground that graphitization is carried out by the electric heating as described later. The temperature of carbonization is preferably 600° C. or higher on the ground that source material films are likely to be hardly adhered each other during the heat treatment in the case of graphitization carried out following lamination, and that displacement of the position of the source material film during the graphitization step due to the decomposed gas and deformation can be prevented, and as a consequence, wrinkles and fractures of the resulting graphite film can be prevented. In other words, shrinkage of the film occurs in the thickness direction and the planer direction in the carbonization step, while shrinkage of the film occurs in the thickness direction and expansion occurs in the planer direction in the graphitization step; therefore, when a polymer film is used as the source material film, shrinkage of the film in the planer direction is suppressed when a pressure is applied in the thickness direction, whereby wrinkles and fractures of the film may occur.

However, even though a pressure is applied in the thickness direction, expansion in the planer direction of the film is promoted by using a carbonized polymer film as the source material film, whereby qualities of the graphite film are likely to be excellent. Additionally, to use a carbonized polymer film as the source material film is preferred, in respect of deformation of the film being able to be suppressed more significantly in comparison with the case of a polymer film, and also prevention of displacement of the position of the film due to deformation being enabled. Furthermore, the source material film and/or the black lead vessel are/is covered by carbon particles described later during the heat treatment in the electric heating. When a carbonized polymer film is used as the source material film, the source material film becomes compact, has greater resistance to corrosion, and becomes less likely to be eroded and/or deteriorated during the heat treatment due to impurities such as metals invaded from the outside, the black lead vessel and the carbon particles, as well as gasses from the outside, whereby a graphite film that is excellent in the flex resistance and thermal diffusivity and has lower variation of qualities in the face (particularly, center and end of the film) can be produced in large quantities.

Additionally, to use the carbonized polymer film as the source material film is preferred, since the electric current flows both in the surface layer and inside, in the graphitization step by electric heating to result in heat generation concurrently proceeds both in the surface layer and inside, whereby homogeneous graphitization occurs. Thus, a graphite film that is excellent in the flex resistance and thermal diffusivity can be obtained.

<Polyimide Film>

In a polyimide film, carbonization and graphitization of the film is more liable to proceed than a source material film including an other organic material as a source material; therefore, the electric conductivity of the film easily becomes uniform at low temperatures, and the electric conductivity per se is also likely to be higher. As a result, when graphitization is carried out by applying a voltage as described later while holding the source material film directly in the electrically accessible vessel, and permitting electrification by applying a voltage to the vessel, the electric current flows in the film portion uniformly as carbonization proceeds, whereby uniform heat generation is caused in the surface and the inside. Thus a graphite having high thermal diffusivity can be obtained not only in the case in which the thickness is small, but also in the case of thick films. Moreover, since the completed graphite has superior crystallinity, and is also excellent in the heat resistance, breakage can be obviated even though local heat is generated through concentration of the electric field, whereby a high quality graphite that is excellent in the flex resistance and thermal diffusivity can be obtained.

<Polyimide Film and Birefringence>

The birefringence $\Delta n$ in connection with the in-plane orientation of the molecules in the polymer film of the present invention is not less than 0.08, preferably not less than 0.10, more preferably 0.12, and most preferably not less than 0.14, in any direction in the film face. When the birefringence is not less than 0.08, carbonization and graphitization of the film become more likely to proceed. As a result, more favorable crystal orientation of the graphite is attained, and the flex resistance and thermal diffusivity can be markedly improved. In addition, as the birefringence becomes greater, carbonization and graphitization of the film can proceed more efficiently, whereby the electric conductivity of the film described later is more likely to be elevated. As a result, in the step of graphitization by applying a voltage while holding the source material film directly in the electrically accessible vessel, and permitting electrification by applying a voltage to the vessel, the electric current flows in the film portion uniformly as carbonization proceeds, and the amount of the electric current that flows in the film increases as carbonization proceed, whereby homogeneous graphitization is more likely to proceed due to uniform heat generation that occurs in the surface and the inside. In addition, since the electric conductivity is elevated evenly in the film face, partial electric field concentration does not occur and thus local heat generation is not caused, whereby homogeneous graphitization proceeds as a result in the surface and the inside. Moreover, since the carbonization and the graphitization proceed at low temperatures, the electric conductivity of the film during the heat treatment at even low temperatures is elevated, whereby homogeneous graphitization is more likely to proceed as uniform heat generation occurs in the surface and the inside. Further, crystallinity becomes more superior and the heat resistance is improved as the birefringence is higher; therefore, a high quality graphite film is obtained without breakage even though the electric field is concentrated to generate a local heat.

The reason for facilitation of graphitization as the birefringence increases is not clear; however, a graphite film that is excellent in the flex resistance and thermal diffusivity can be obtained with more highly orientated polyimide films among the polyimide films, since rearrangement of molecules required for graphitization can be minimized in the polyimide film having a greater birefringence and superior in the molecular orientation.

<Birefringence>

The term "birefringence" referred to herein means a difference between a refractive index in any in any in-plane direction of a film and a refractive index in the thickness direction. The birefringence $\Delta nx$ in any in-plane direction X of a film is derived by the following formula (mathematical formula 1).

Birefringence $\Delta nx$=(refractive index $Nx$ in the in-plane direction $X$)−(refractive index $Nz$ in the thickness direction)

[Mathematical formula 1]

Birefringence $\Delta nx$=(Refractive index in the in-plane $X$ direction $Nx$)−(Refractive index in the thickness direction $Nz$)    (1)

Figure 10:
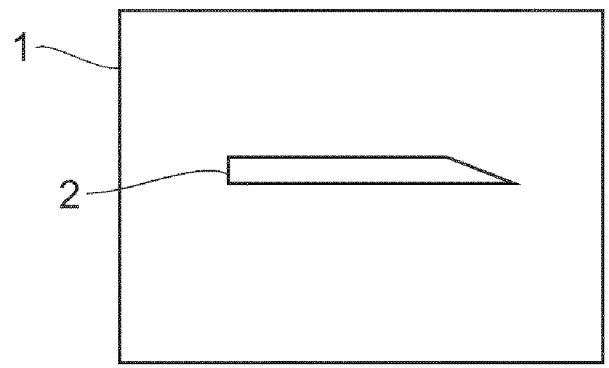
FIG. 10 shows a view illustrating a polyimide film and a wedge-shaped sheet.
Figure 11:
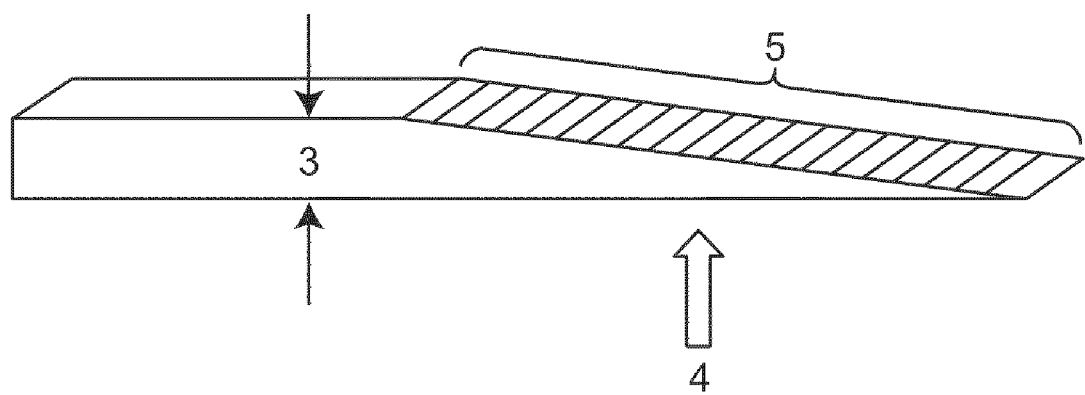
FIG. 11 shows a perspective view illustrating a wedge-shaped sheet.

FIGS. 10 and 11 illustrate a specific method for measuring birefringence. Referring to a plan view of FIG. 11, a wedge-shaped sheet 2 is cut out as a measurement specimen from a film 1. The wedge-shaped sheet 2 has a long trapezoidal shape with an oblique line, and one base angle thereof is a right angle. The wedge-shaped sheet 2 is cut out such that the bottom of the trapezoid is parallel to the X direction. FIG. 11 is a perspective view of the measurement specimen 2 thus cut out. Sodium light 4 is applied at right angles to a cutout cross-section corresponding to the bottom of the trapezoidal specimen 2, and a cutout cross-section corresponding to the oblique line of the trapezoidal specimen 2 is observed with a polarization microscope. Thereby, interference fringes 5 are observed. The birefringence $\Delta nx$ in the in-plane direction X is represented by the following formula (mathematical formula 2):

[Mathematical formula 2]

$\Delta nx = n^* \lambda / d$ wherein, $\lambda$ is the wavelength of sodium D ray, i.e., 589 nm, and d is the width 3 of the specimen corresponding to the height of the trapezoid of the specimen 2.

Note that the term "in an in-plane direction X of a film" means that, for example, the X direction is any one of in-plane directions of 0°, 45°, 90°, and 135° on the basis of the direction of flow of materials during the formation of the film. The measurement place and the measurement time of the specimen are preferably as in the following. For example, when a specimen is cut away from a roll-shaped source material film (width: 514 mm), sampling is conducted at six sites in the width direction with an interval of 10 cm, and the birefringence is measured for each site. The average is determined as the birefringence.

<Thermal Properties, Mechanical Properties, Physical Properties and Chemical Properties of Polyimide Film>

Furthermore, the polyimide film used in the present invention, which is a source material for the graphite, may have a mean coefficient of linear expansion of less than $2.5 \times 10^{-5}/°$C. in a range of 100° C. to 200° C. When the coefficient of linear expansion is less than $2.5 \times 10^{-5}/°$C., the graphitization proceeds smoothly with less elongation during the heat treatment, whereby a graphite that is not fragile and has excellent various properties can be obtained. By using such a polyimide film for a source material, transformation into a graphite starts from 2,400° C. and transformation into a graphite of sufficiently high crystallinity can take place at 2,700° C. The coefficient of linear expansion is more preferably no higher than $2.0 \times 10^{-5}/°$C.

Note that the coefficient of linear expansion of the polymer film is obtained by the following method. Using a thermomechanical analyzer (TMA), a specimen is heated to 350° C. at a heating rate of 10° C./min and then air-cooled to room temperature. The specimen is heated again to 350° C. at a heating rate of 10° C./min, and the mean coefficient of linear expansion at 100° C. to 200° C. during the second heating is measured. Specifically, using a thermomechanical analyzer (TMA: SSC/5200H; TMA120C manufactured by Seiko Electronics Industry Co., Ltd.), a film specimen with dimensions of 3 mm in width and 20 mm in length is fixed on a predetermined jig, and measurement is performed in the tensile mode under a load of 3 g in a nitrogen atmosphere.

Furthermore, the polyimide film used in the present invention preferably has an elastic modulus of 3.4 GPa or more from the standpoint that graphitization can be more easily performed. That is, when the elastic modulus is 3.4 GPa or more, it is possible to avoid breakage of the film resulting from shrinkage of the film during heat treatment. Thus, it is possible to obtain graphite that is excellent in various properties.

Note that the elastic modulus of the film can be measured in accordance with ASTM-D-882. The polyimide film more preferably has an elastic modulus of 3.9 GPa or more, and still more preferably 4.9 GPa or more. When the elastic modulus of the film is less than 3.4 GPa, breakage and deformation easily occur due to shrinkage of the film during heat treatment, and the resulting graphite tends to have inferior crystallinity, and deteriorated thermal diffusivity.

The coefficient of water absorption of the film was measured as described below. For achieving absolute dryness, the film is dried at 100° C. for 30 min to produce a 10 cm×square specimen having a thickness of 25 μm. The weight of this specimen is measured and defined as A1. The 10 cm×square specimen having a thickness of 25 μm was immersed in distilled water at 23° C. for 24 hrs, and water of the surface was wiped to remove, and the weight of the specimen was measured immediately after the removal. This weight is defined as A2. The coefficient of water absorption was determined according to the following formula.

Coefficient of water absorption(%)=$(A2-A1)/A1 \times 100$

<Production Method of Polyimide Film>

The polyimide film used in the present invention can be formed by flow-casting an organic solution of a polyamic acid which is a precursor of the polyimide, after mixing the solution with an imidization accelerator onto a support such as an endless belt or stainless steel drum, followed by drying, baking and imidization. A known process can be used as the process for producing the polyamic acid used in the present invention. Usually, at least one aromatic dianhydride and at least one diamine are dissolved in substantially equimolar amounts in an organic solvent. The resulting organic solution is stirred under controlled temperature conditions until polymerization between the acid dianhydride and the diamine is completed. Thereby, a polyamic acid is produced. Such a polyamic acid solution is obtained usually at a concentration of 5% to 35% by weight, and preferably 10% to 30% by weight. When the concentration is in such a range, a proper molecular weight and solution viscosity can be obtained.

As the polymerization method, any of the known methods can be used. For example, the following polymerization methods (1) to (5) are preferable.

(1) A method in which an aromatic diamine is dissolved in a polar organic solvent, and a substantially equimolar amount of an aromatic tetracarboxylic dianhydride is allowed to react therewith to perform polymerization.

(2) A method in which an aromatic tetracarboxylic dianhydride and a less than equimolar amount of an aromatic diamine compound with respect thereto are allowed to react with each other in a polar organic solvent to obtain a pre-polymer having acid anhydride groups at both termini. Subsequently, polymerization is performed using an aromatic diamine compound so as to be substantially equimolar with respect to the aromatic tetracarboxylic dianhydride.

In one preferable aspect of this embodiment, a method is provided in which a pre-polymer having the acid dianhydride at both termini is synthesized using diamine and acid dianhydride, and the pre-polymer is allowed to react with diamine that is different from the above diamine, thereby synthesizing polyamic acid.

(3) A method in which an aromatic tetracarboxylic dianhydride and an excess molar amount of an aromatic diamine compound with respect thereto are allowed to react with each other in a polar organic solvent to obtain a pre-polymer having amino groups at both termini. Subsequently, after adding an additional aromatic diamine compound to the pre-polymer, polymerization is performed using an aromatic tetracarboxylic dianhydride such that the aromatic tetracarboxylic dianhydride and the aromatic diamine compound are substantially equimolar to each other.

(4) A method in which an aromatic tetracarboxylic dianhydride is dissolved and/or dispersed in a polar organic solvent, and then polymerization is performed using an aromatic diamine compound so as to be substantially equimolar to the acid dianhydride.

(5) A method in which a mixture of substantially equimolar amounts of an aromatic tetracarboxylic dianhydride and an aromatic diamine are allowed to react with each other in a polar organic solvent to perform polymerization.

Among these, the polymerization methods shown in above (2) and (3) in which sequential control (sequence control; control of combination of block polymers, and linkage of the block polymer molecules) is used by way of a pre-polymer are preferable, because it is possible to easily obtain a polyimide film having a high birefringence and a low coefficient of linear expansion by using such a method, and also because it becomes possible to easily obtain a graphite having high crystallinity, and excellent density and thermal diffusivity by heat-treating this polyimide film. Furthermore, it is assumed that by thus controlling in a regular fashion, the overlap between aromatic rings increases, and graphitization is allowed to proceed easily even by low-temperature heat treatment. In addition, when the content of the imide group is elevated for increasing the birefringence, carbon proportion in the resin is lowered, the yield of carbonization after subjecting to the black lead processing is lowered; however, the polyimide film synthesized while conducting sequential control is preferred because the birefringence can be increased without lowering the carbon proportion in the resin. Since the carbon proportion is elevated, generation of decomposed gas can be inhibited, whereby a graphite film having favorable appearance is more likely to be obtained. Also, rearrangement of the aromatic ring can be suppressed, and thus a graphite film that is excellent in thermal diffusivity can be obtained.

In the present invention, examples of the acid dianhydride which can be used for the synthesis of the polyimide include pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenone tetracarboxylic dianhydride, 2,2-bis(3,4-dicarboxyphenyl)propane dianhydride, 3,4,9,10-perylene tetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic dianhydride, bis(3,4-dicarboxyphenyl)sulfone dianhydride, p-phenylenebis(trimellitic acid monoester acid anhydride), ethylene bis(trimellitic acid monoester acid anhydride), bisphenol A bis(trimellitic acid monoester acid anhydride), and analogues thereof. These may be used alone or as a mixture in combination of two or more at an appropriate ratio.

In the present invention, examples of the diamine which can be used for the synthesis of the polyimide include 4,4'-oxydianiline, p-phenylenediamine, 4,4'-diaminodiphenyl propane, 4,4'-diaminodiphenyl methane, benzidine, 3,3'-dichlorobenzidine, 4,4'-diaminodiphenyl sulfide, 3,3'-diaminodiphenyl sulfone, 4,4'-diaminodiphenyl sulfone, 4,4'-diaminodiphenyl ether (4,4'-oxydianiline), 3,3'-diaminodiphenyl ether (3,3'-oxydianiline), 3,4'-diaminodiphenyl ether (3,4'-oxydianiline), 1,5-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene (p-phenylenediamine), 1,3-diaminobenzene, 1,2-diaminobenzene, and analogues thereof. These may be used alone or as a mixture in combination of two or more at an appropriate ratio.

In particular, from the standpoint that the coefficient of linear expansion can be decreased, the elastic modulus can be increased, and the birefringence can be increased, use of an acid dianhydride represented by the following formula (1) as a source material is preferable in the production of the polyimide film in the present invention.

[Chemical formula 1]

Formula (1)

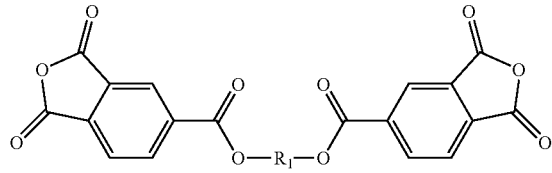

In the formula, $R_1$ represents any one of divalent organic groups represented by the following formula (2) to formula (14):

[Chemical formula 2]

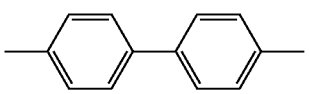
Formula (2)

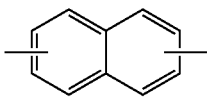
Formula (3)

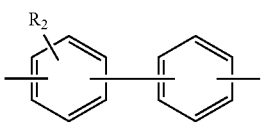
Formula (4)

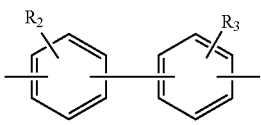
Formula (5)

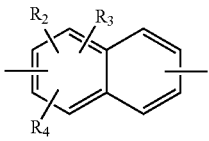
Formula (6)

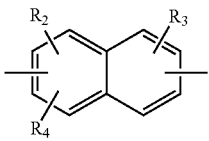
Formula (7)

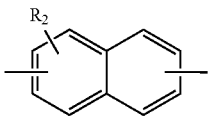
Formula (8)

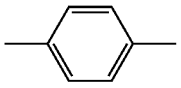
Formula (9)

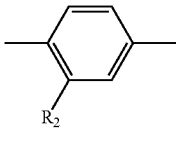
Formula (10)

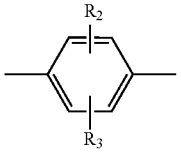
Formula (11)

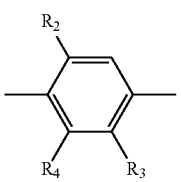
Formula (12)

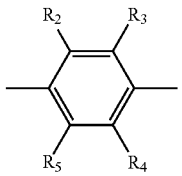
Formula (13)

Formula (14)

wherein, $R_2$, $R_3$, $R_4$, and $R_5$ may each represent any one selected from the group consisting of —$CH_3$, —Cl, —Br, —F, or —$OCH_3$.

By using the acid dianhydride described above, it is possible to obtain a polyimide film having a relatively low coefficient of water absorption, which is also preferable from the standpoint that foaming due to moisture can be prevented in the graphitization process In particular, use of any one of the benzene nucleus-containing organic groups represented by the formula (2) to formula (14) 2 as $R_1$ in the acid dianhydride is preferable from the standpoint that the resulting polyimide film has high molecular orientation, a low coefficient of linear expansion, a high elastic modulus, a high birefringence, and a low coefficient of water absorption.

An acid dianhydride represented by the following formula (15) may be used as a source material in the synthesis of the polyimide in the present invention to further decrease the coefficient of linear expansion, increase the elastic modulus, increase the birefringence, and decrease the coefficient of water absorption.

[Chemical formula 3]

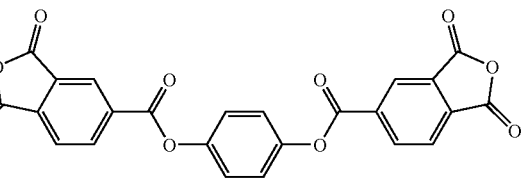
Formula (15)

In particular, with respect to a polyimide film produced using, as a source material, an acid dianhydride having a structure in which benzene rings are linearly bonded by two or more ester bonds, although folded chains are involved, a highly linear conformation is easily formed as a whole, and the polyimide film has a relatively rigid property. As a result, by using this source material, it is possible to decrease the coefficient of linear expansion of the polyimide film, for example, to $1.5 \times 10^{-5}/°$ C. or less. In addition, the elastic modulus can be increased to 500 kgf/mm² (490 GPa) or more, and the coefficient of water absorption can be decreased to 1.5% or less.

The polyimide of the present invention is preferably synthesized using p-phenylenediamine as a source material to further decrease the coefficient of linear expansion, increase the elastic modulus, and increase the birefringence.

Furthermore, in the present invention, the diamine most suitably used for the synthesis of the polyimide includes 4,4'-oxydianiline and p-phenylenediamine. The number of moles of one of these or both is preferably 40 mole percent or more, more preferably 50 mole percent or more, even more preferably 70 mole percent or more, and still more preferably 80 mole percent or more relative to the total diamine content. Furthermore, p-phenylenediamine is included preferably in an amount of 10 mole percent or more, more preferably 20 mole percent or more, even more preferably 30 mole percent or more, and still more preferably 40 mole percent or more. If the contents of these diamines are below the lower limits of these mole percent ranges, the resulting polyimide film tends to have an increased coefficient of linear expansion, a decreased elastic modulus, and a decreased birefringence. However, when the total diamine content is entirely composed of p-phenylenediamine, it is difficult to obtain a thick polyimide film which does not substantially foam. Therefore, use of 4,4'-oxydianiline is preferable. Additionally, the carbon proportion is lowered, thereby enabling to reduce the amount of generation of the decomposed gas. Thus, necessity for rearrangement of the aromatic ring is reduced, and a graphite that is excellent in the appearance and thermal diffusivity can be obtained.

Most appropriate acid dianhydride used for synthesis of the polyimide film in the present invention is pyromellitic dianhydride and/or p-phenylenebis(trimellitic acid monoester acid dianhydride) represented by the formula (15), and it is preferred that the mole percent of these, alone or in terms of total moles of the two be not less than 40% by mole, further not less than 50% by mole, still further not less than 70% by mole, and yet further not less than 80% by mole based on the entire acid dianhydride. When the amount of the acid dianhydride used is less than 40% by mole, the resulting polyimide film will tend to have a large coefficient of linear expansion, a small elastic modulus, and small birefringence.

Additionally, an additive such as carbon black or graphite may be added to the polyimide film, polyamic acid, and the polyimide resin.

Preferred examples of the solvent for the synthesis of the polyamic acid include amide solvents, such as N,N-dimethylformamide, N,N-dimethylacetamide, and N-methyl-2-pyrrolidone, and N,N-dimethylformamide and N,N-dimethylacetamide are particularly preferably used.

The polyimide may be produced using either a thermal cure method or a chemical cure method. In the thermal cure method, a polyamic acid, which is a precursor, is imidized by heating. In the chemical cure method, a polyamic acid is imidized using a dehydrating agent represented by an acid anhydride, such as acetic anhydride, and a tertiary amine, such as picoline, quinoline, isoquinoline, or pyridine, as an imidization accelerator. Above all, a tertiary amine having a higher boiling point, such as isoquinoline, is more preferable because such a tertiary amine is not evaporated in the initial stage during the production process of the film and a catalytic effect is likely to be exhibited until the final step of drying. In particular, from the standpoints that the resulting film tends to have a low coefficient of linear expansion, a high elastic modulus, and a high birefringence and that rapid graphitization is enabled at relatively low temperatures and a quality graphite can be obtained, chemical curing is preferable. Furthermore, combined use of the dehydrating agent and the imidization accelerator is preferable because the resulting film can have a decreased coefficient of linear expansion, an increased elastic modulus, and an increased birefringence. Moreover, in the chemical cure method, since imidization reaction proceeds more rapidly, the imidization reaction can be completed for a short period of time in heat treatment. Thus, the chemical cure method has high productivity and is industrially advantageous.

In a specific process for producing a film using chemical curing, first, stoichiometric amounts or more of a dehydrating agent and an imidization accelerator composed of a catalyst are added to a polyamic acid solution, the solution is flow-cast or applied onto a support, e.g., a supporting plate, an organic film, such as PET, a drum, or an endless belt, so as to be formed into a film, and an organic solvent is evaporated to obtain a self-supporting film. Subsequently, the self-supporting film is imidized while drying by heating to obtain a polyimide film. The heating temperature is preferably in a range of 150° C. to 550° C. Although the heating rate is not particularly limited, preferably, gradual heating is performed continuously or stepwise so that the maximum temperature reaches the predetermined temperature range. The heating time depends on the thickness of the film and the maximum temperature. In general, the heating time is preferably 10 seconds to 10 minutes after the maximum temperature is achieved. Moreover, it is preferable to include a step of making the film contact with or fix/be held on the vessel, or drawing the film in order to prevent shrinkage in the production process of the polyimide film because the resulting film tends to have a smaller coefficient of linear expansion, a higher elastic modulus, and a higher birefringence.

<Coefficient of Thermal Diffusivity in Planer Direction of Graphite Film>

The coefficient of thermal diffusivity in a planer direction of the graphite film of the present invention may be not less than $8.0\times10^{-4}$/s, preferably not less than $8.5\times10^{-4}$ m$^2$/s, and more preferably not less than $9.0\times10^{-4}$ m/s. When the coefficient of thermal diffusivity is not less than $8.0\times10^{-4}$ m$^2$/s, the heat can be easily escaped from the heat generating instrument by virtue of high thermal diffusivity, elevation of the temperature of the heat generating instrument can be prevented. To the contrary, when the coefficient of thermal diffusivity is less than $8.0\times10^{-4}$/s, the heat can not be escaped from the heat generating instrument due to inferior thermal diffusivity, elevation of the temperature of the heat generating instrument may not be prevented.

Generally, the flex resistance and thermal diffusivity of the graphite film obtained by a polymer degradation method are contradictory properties, and the thermal diffusivity is often deteriorated when the flex resistance is sought. However, since the graphite film of the present invention has both high thermal diffusivity and flex resistance together, it is very advantageous when used in electronic instruments in which the amount of heat generation increases while downsizing advances, in recent years.

<Post Planar Compression Step>

In the manufacturing method of the graphite film according to the present invention, a step (post planar compression step) of further compressing the graphitized source material film, i.e., the graphite film via the aforementioned graphitization step into a planer state is preferably included. This step of post planar compression is an important step for producing a graphite film that is excellent in flex resistance and coefficient of thermal diffusivity and has superior flatness without flaw, dint and wrinkle on the surface thereof and also for improving the flex resistance, in particular. Such a "post planar compression step" can be also carried out at a room temperature. In this "post planar compression step", it is preferred that compression is carried out into a planar state together with a filmy medium other than the graphite film described above. For taking a photograph of the aforementioned SEM image, the operation should be conducted after completing this "post planar compression step".

In addition, the aforementioned graphite film is preferably compressed into a planar state while a plurality of pieces of the films are placed to be laminated. Thus, the graphite film itself serves as a buffer, whereby a graphite film can be obtained that is superior in flatness without being flawed on the surface.

Such "post planar compression" may be carried out with veneer pressing or vacuum pressing or the like, and vacuum pressing is particularly preferred in light of ability to execute compression of the air layer included in the graphite film by virtue of the vacuum drawing, in addition to an advantage of capability of compressing evenly into a planar state.

More specifically, a method in which a graphite film is compressed using an apparatus that enables compression into a planar state, such as a pressing machine, a hot pressing machine, or a veneer pressing machine, or a method in which a graphite film is sandwiched between plastic plates, ceramic plates, or metal plates and then clamped with a bolt may be exemplified. By using these methods, the film can be compressed evenly into a planar state, without causing breakage of the graphite layers, not accompanied by lowering of the coefficient of thermal diffusivity, and thus a graphite film having a high coefficient of thermal diffusivity and a high density, and without flaw and wrinkles on the surface can be obtained. Moreover, in order to provide a more uniform film, heating may be conducted during the compression.

Moreover, as a method for vacuum pressing, a method in which a vacuum pressing machine, such as a pressing machine, a hot pressing machine or a veneer pressing machine, including a pressing machine to which a function for vacuum drawing is imparted is used to execute compression, or a method in which a graphite film is sandwiched between plastic plates, ceramic plates, or metal plates and then clamped with a bolt, followed by vacuum drawing the whole, as well as a method in which a graphite film is sandwiched between rubbers as in vacuum rubber pressing, and then the inside is vacuum drawn to allow the pressure inside to be reduced, whereby the film is evenly compressed may be exemplified. According to these methods, in addition to capability of compressing evenly into a planar state, compression of the air layer included in the graphite film is executed by virtue of the vacuum drawing, whereby the film can be compressed evenly into a planar state, without causing breakage of the graphite layers, not accompanied by lowering of the coefficient of thermal diffusivity, and thus a graphite film having a high coefficient of thermal diffusivity and a high density, and without flaw and wrinkles on the surface can be obtained. Additionally, when the vacuum pressing is carried out, vacuum drawing is preferably conducted prior to the compression. There may be a case in which wrinkles are generated when the compression process is carried out first; however, when the pressure reduction is conducted beforehand, the graphite film can be evenly compressed as a whole, whereby a quality graphite film can be obtained without generation of wrinkles. Moreover, in order to provide a more uniform film, heating may be conducted during the compression also in this method. Since the graphite film is excellent in thermal diffusivity, the heat can be transferred homogenously. Accordingly, an advantageous effect of providing a smooth graphite film being uniform in the face can be achieved.

By thus compressing evenly in the planer direction, stronger compression can be carried out as compared with a rolling treatment; therefore, a graphite film that is significantly superior in flex resistance can be obtained as compared with the case of the rolling treatment.

<Filmy Medium>

Illustrative examples of the filmy medium other than the aforementioned graphite film include graphite films obtained from natural black lead, resin films, metal foils, and the like. Specifically, graphite films obtained from natural black lead, shock-absorbing rubber materials, iron plates, Teflon (registered trademark) film, and the like may be exemplified.

The phrase "together with a filmy medium" described above may involve aspects as illustrated in the following: for example, to sandwich in the order of "a medium other than the graphite film/a piece of the aforementioned graphite film/a medium other than the graphite film/a piece of the aforementioned graphite film/a medium other than the graphite film/ and so forth" etc., to sandwich in the order of "a medium other than the graphite film/plural pieces of the aforementioned graphite film/a medium other than the graphite film/plural pieces of the aforementioned graphite film/a medium other than the graphite film/and so forth", and the like.

<Construction of Graphite Composite Film>

The graphite composite film of the present invention may include a plastic film on at least one face and/or both faces formed via an adhesive material, an adhesive or the like for the purpose of improving the flex resistance. In addition, thus combined plastic film may be responsible for imparting an insulation property to the graphite film having electric conductivity. Examples of the material of the plastic film include polyimide, polyethylene terephthalate, epoxy, and the like. These materials are excellent in heat resistance, and satisfactory long-term reliability can be achieved even though the film is used in combination with a heat-generating component or a heat-dissipating component.

The plastic film may have a thickness of not greater than 50 $\mu$m, preferably not greater than 35 $\mu$m, and still more preferably not greater than 15 $\mu$m. When the thickness is greater than 50 $\mu$m, the excellent thermal diffusivity of a graphite film may be impaired when used in combination with the graphite film. Furthermore, the plastic film may have a thickness of not less than 10 $\mu$m. When the thickness is less than 10 $\mu$m, sufficient adhesiveness cannot be kept, and long-term reliability can be inferior also when used in combination with a heat-generating component or a heat-dissipating component.

Further, the thickness of the adhesive material or the adhesive used in laminating the plastic film may be not greater than 50 $\mu$m, preferably not greater than 35 $\mu$m, and still more preferably not greater than 15 $\mu$m. When the thickness is greater than 50 $\mu$m, the excellent thermal diffusivity of a graphite film may be impaired when used in combination with the graphite film. In addition, the adhesive material and the adhesive may be composed of a material such as an acrylic resin, an epoxy resin, a polyimide resin, or the like.

<Application and the Like>

Since the graphite film of the present invention is also excellent in flexibility and electric conductivity, it is particularly suited for use that takes advantage of these features. The feature the is excellent in heat conductivity of the graphite film is suited for use in which effects such as heat transferring ability, heat dissipating ability, heat spreading ability, heat uniformizing ability, accelerating ability of heat response, quick warming ability, quick cooling ability and the like may be required. By spreading the heat instantly, sudden change of temperature can be prevented or moderated, or concentration of local heating can be obviated. Alternatively, to the contrary, it can be applied to use in which sudden change should be caused, or slight heat change should be detected. By moderating the heat, the strength and adhesiveness can be ensured even in high-temperature environments. In addition, by transferring the heat in an even and accurate manner, improvement of the properties such as high accuracy, high grade and high image quality are also enabled. In the case of use in manufacturing apparatuses, improvement of productivity is enabled by shortening of tact time, improvement of heat cooling efficiency, improvement of drying efficiency, speeding up, and shortening of latency time, taking advantage of the features that enable the heat to transfer rapidly in a larger amount. Additionally, reduction of defects, and enhancement of keep warm function are also enabled by virtue of uniformization and quick transfer of the heat. Furthermore, by incorporating into various instruments, space-saving, film thinning, weight saving, mechanical simplification, and improvement of degree of freedom of settlement are enabled, thereby also capable of saving electric power, and silencing, by eliminating unnecessary components. In addition, since the heat can be escaped, deterioration of properties does not occur even in heat cycle environment tests and annealing treatments, and solder heat resistant, adhesiveness of adhesion layers, heat resistance, reliability and durability can be improved. Also, thermal insulation properties can be improved, and protection from heat sensitive components are enabled. Consequently, maintenanceless and cost down advantages can be realized, and it would be also possible to enhance safety.

As specific use, the followings may be exemplified as suitable applications. For example, servers, personal computers for servers, desktop personal computers, word processors, keyboards, electronic instruments for games, laptop computers, electronic dictionaries, PDAs, mobile phones, portable game instruments, portable electronic instruments such as portable music players. liquid crystal displays, transmissive liquid crystal display devices, reflective LCD panels, plasma displays, SEDs, LEDs, organic ELs, inorganic ELs, liquid crystal projectors, rear projectors, liquid crystal panels, backlight apparatuses (for preventing variance, and improving temperature variation), TFT substrates, electron emission elements, electron source substrates and face plates (for weight saving), compounding with display panel frames, light emitting elements, optical display instruments and components thereof such as charge-injecting light emitting elements and clocks. Light emitting illumination apparatuses such as lasers, semiconductor lasers, light emitting diodes, fluorescent lights, incandescent lamps, light emitting dots, light emitting element arrays, illumination units, plane light emitting apparatuses, and document illumination apparatuses. Ink jet printer (ink head) apparatuses and components thereof such as recording heads (heaters, heat insulating materials, thermal storage layers etc.) composed of single or multiple heads for ink jet (ejecting ink utilizing a thermal energy), line head, longer ink heads, solid ink jet apparatuses, heat-dissipating plates for ink jet heads, ink cartridges, silicon substrates for ink jet heads, ink jet activating drivers, and heat sources for heating ink jet recording paper (halogen lamp heater). Electronic photograph apparatuses and image forming apparatuses, and components thereof including e.g., as toner cartridges, apparatuses having a laser light source, scanning optical apparatuses (light rays exit unit, deflection scanning polygonal mirrors, polygonal mirror rotating drive motors, optical components leading to photo conductor drams), exposure apparatuses, development apparatuses (photo conductor drams, photo receptor members, development rollers, development sleeves, cleaning apparatuses), transfer apparatuses (transfer rolls, transfer belts, middle transfer belts etc.), fixing apparatuses (fixing rolls (cores, circumferential members, halogen heaters etc.), surf heaters, electromagnetic induction heaters, ceramic heaters, fixing films, film heating apparatuses, heating rollers, compression rollers, heating bodies, compression members, belt nips), sheet cooling apparatuses, sheet disposing apparatuses, sheet discharging apparatuses, sheet processing apparatuses. In fixing apparatuses, the effect of improving heat characteristics exhibited by using the graphite film is prominent, and image qualities variation in the width direction, image qualities defects, image qualities fluctuation in continuous paper feed, rise and fall time, real time response, high following depending on temperatures, temperature difference between paper feed part and unfed part, wrinkle, strength, electric power saving, on-demand heating, high- and low-temperature offset, excessive temperature elevation around the heater, and fracture of the heater can be significantly improved. Other recording apparatuses such as thermal transfer recording apparatuses (ribbons), dot printers, and sublimation printers. Components relating to semiconductors such as semiconductor elements, semiconductor packages, semiconductor sealing cases, semiconductor die bondings, semiconductor chips for driving liquid crystal display elements, CPUs, MPUs, memories, power transistors, and power transistor cases. Wiring boards such as printed-circuit boards, rigid wiring plates, flexible wiring plates, ceramic wiring plates, build-up wiring plates, circuit boards for mounting, printed circuit boards for high-density mounting, (tape carrier packages), TABs, hinge mechanisms, sliding mechanisms, through holes, resin packagings, sealing materials, multilayer resin molded products, and multilayer boards. Recording apparatuses, recording and reproduction apparatuses and components thereof such as CDs, DVDs (light pick up, laser generation apparatuses, laser acceptance apparatuses), Blu-ray discs, DRAMs, flash memories, hard disk drives, optical recording and reproduction apparatuses, magnetic recording and reproduction apparatuses, magneto optical recording and reproduction apparatuses, information recording media, optical recording disks, magneto optical recording media (translucent substrate, optical interference layer, domain wall displacement layer, mid layer, recording layer, protective layer, heat-dissipating layer, information track), photo acceptance elements, photo detection elements, light pickup apparatuses, magnetic heads, magnetic heads for magneto optical recording, semiconductor laser chips, laser diodes, and laser driving ICs. Image recording apparatuses and components thereof such as digital cameras, analog cameras, digital single-lens reflex cameras, analog single lens reflex cameras, digital cameras, digital video cameras, cameras for integrated VTRs, ICs for integrated VTRs with a camera, lights for video cameras, electronic flare apparatuses, imaging apparatuses, imaging tube cooling apparatuses, imaging apparatuses, imaging elements, CCD elements, lens barrels, image sensors and information processing apparatuses using the same, X-ray absorbent core patterns, X-ray mask structural bodies, X-ray photographic apparatuses, X-ray exposure apparatuses, X-ray plane detectors, X-ray digital photographic apparatuses, X-ray area sensor boards, specimen cooling holders for electron microscope, electronic beam drawing apparatuses (electronic guns, electronic guns, electronic beam drawing apparatuses), radial ray detection apparatuses and radial ray imaging systems, scanners, image reading apparatuses, imaging elements for moving pictures and imaging elements for still pictures, and microscopes. Heat-dissipating materials of battery instruments including primary electric cells such as alkali cells and manganese cells, secondary electric cells such as lithium ion cells, nickel hydrogen and lead-storage electric cells, electric bilayer capacitors, electrolytic capacitors, battery packs, solar cells, solar cell module installation structures, photoelectric conversion boards, photoelectromotive force element arrays, electric generating elements, and fuel electric cells (electric generating cells, housing exterior portions, fuel tank interior portions). Electric power supplies and components thereof such as electric power supplies (rectifier diodes, trans), DC/DC converters, switching electric power supply apparatuses (forward type), electric current leads and superconductive apparatus system. Motor and components thereof such as motors, linear motors, plane motors, oscillatory motors, motor coils, circuit units for driving rotational control, motor drivers, inner rotor motors and oscillatory actuators. Deposit film manufacturing apparatuses (with constant temperature, for quality stabilization) and components thereof such as vacuum processing apparatuses, semiconductor manufacturing apparatuses, vapor deposition apparatuses, thin film single-crystalline semiconductor layer manufacturing apparatuses, plasma CVDs, micro wave plasma CVDs, sputtering apparatuses, vacuum pumping apparatuses such as reduced pressure chambers, vacuum pumps and cryo trap-cryo pumps, electrostatic chucks, vacuum chucks, pin chuck type wafer chucks, targets for sputtering, semiconductor exposure apparatuses, lens holding apparatuses and projection exposure apparatuses and photomasks. A variety of manufacturing apparatuses and components thereof such as heat treatment apparatuses by ohmic resistance heating, induction heating, and infrared ray heating, dryers, annealing apparatuses, lamination apparatuses, reflowing apparatuses, heating adhesion (contact bonding) apparatuses, injection molding apparatuses (nozzle□heating portions), resin molding dies, LIM molding, roller molding apparatus modifying gas manufacturing (modifying portions, catalyst portions, heating portions, etc.) stampers, (for filmy, roll, recording media), bonding tools, catalyst reaction vessels, chilling machines, coloring apparatus of color filter boards, heat cooling apparatuses of resists, welding instruments, films for magnetic induction heating, dew condensation preventing glasses, residual liquid quality sensing apparatuses and heat exchange apparatuses. Heat insulation apparatuses such as heat insulating materials, vacuum heat insulating materials and radiation heat insulating materials. Chassis, housing, outer packaging covers for various electronic and electric instruments, and manufacturing apparatuses. Heat-dissipating components such as heat wasters, openings, heat pipes, heat sinks, fins, fans and connectors for heat dissipation. Cooling components such as Peltier elements, electric heat transfer elements and water-cooling components. Temperature regulation apparatuses, thermal control apparatuses, temperature detection apparatuses and components. Heat generator associated components such as thermistors, thermometal cut-out, thermostats, temperature fuses, excess voltage prevention elements, termoprotectors, ceramic heaters, flexible heaters, composite products of a heater, a heat-conducting plate and a heat insulating material, and heater connector electrode terminal components. Radiation components having a high emissivity, electromagnetic shielding components such as electromagnetic wave shieldings and electromagnetic wave absorbent cores, composite products with a metal such as aluminum, copper or silicon, composite products with a ceramic such as silicon nitride, boron nitride or alumina.

EXAMPLES

Hereinafter, various Examples of the present invention will be described along with several Comparative Examples.
<Graphite Films A and B>
[Production Method of Polyimide Film A]
Pyromellitic dianhydride (1 equivalent) was dissolved in a solution prepared by dissolving 1 equivalent of 4,4'-oxydianiline in DMF (dimethylformamide) to produce a polyamic acid solution (18.5 wt %).
While cooling the resulting solution, an imidization catalyst containing 1 equivalent of acetic anhydride and 1 equivalent of isoquinoline, relative to the carboxylic acid group contained in the polyamic acid, and DMF was added thereto, followed by defoaming. Subsequently, the resulting mixed solution was applied on an aluminum foil such that a predetermined thickness was achieved after drying. The mixed solution layer on the aluminum foil was dried using a hot-air oven and a far-infrared heater.

The drying conditions for producing a film having a final thickness of 75 µm are shown in the following. The mixed solution layer on the aluminum foil was dried in a hot-air oven at 120° C. for 240 seconds to produce a self-supporting gel film. The resulting gel film was stripped off from the aluminum foil and fixed on a frame. The gel film was dried by heating stepwise in a hot-air oven at 120° C. for 30 seconds, at 275° C. for 40 seconds, at 400° C. for 43 seconds, and at 450° C. for 50 seconds, and with a far-infrared heater at 460° C. for 23 seconds.

As described in the foregoing, a polyimide film A having a thickness of 75 µm (elastic modulus: 3.1 GPa, coefficient of water absorption: 2.5%, birefringence: 0.10, coefficient of linear expansion $3.0 \times 10^{-5}/°$ C.) was produced.

[Production Method of Polyimide Film B]
A polyimide film B was obtained in a similar manner to the polyimide film A except that application was conducted on the aluminum foil to give a final thickness of 50 µm, and the baking time was set to ⅔ fold of that in the case of the final film thickness being 75 µm.

[Production Method of Carbonized Film A]
The polyimide film A having a thickness of 75 µm was sandwiched between black lead plates, and subjected to a carbonization treatment using an electric furnace, by elevating the temperature to 1,000° C. Thus carbonized film is designated as carbonized film A.

[Production Method of Carbonized Film B]
A carbonized film B was produced in a similar manner to the carbonized film A except that the polyimide film B having a thickness of 50 µm was used.

<Measurement of Density of Graphite Film>
The density of the graphite film was calculated by a division process of: dividing the weight (g) of the graphite film by the volume ($cm^3$) of the graphite film, i.e., product of length×width×thickness. The thickness of the graphite film employed was an average value of measurements at any ten positions.

<Measurement of Thickness of Graphite Film>
In a method for measuring the thickness of the graphite film, a 50 mm×50 mm film was subjected to measurement at any ten positions using a thickness gauge (manufactured by Heidenhain Co., Ltd., HEIDENHAIN-CERTO) in a temperature-controlled room at a room temperature of 25° C., and the average was derived from the measurements.

<Measurement of Coefficient of Thermal Diffusivity in Planer Direction of Film by Optical Alternating Current Method>
The situation of progress of graphitization is determined by measuring a coefficient of thermal diffusivity in a planer direction of the film, meaning that graphitization is more prominent as the coefficient of thermal diffusivity is higher. The coefficient of thermal diffusivity was measured with a graphite film cut into a shape of 4×40 mm specimen, using an apparatus for measuring coefficient of thermal diffusivity (available from ULVAC-RIKO, Inc. "LaserPit") according to an optical alternating current method in an atmosphere of 20° C., at 10 Hz.

<MIT Folding Endurance Test of Graphite Film>

A MIT folding endurance test of a graphite film was carried out. The graphite film was cut into 1.5×10 cm, and subjected to measurement using a MIT flex resistant fatigue testing machine model D manufactured by TOYO SEIKI Co., Ltd., at a test load of 100 gf (0.98 N) and a rate of 90 times/min, with two series of a curvature radius R of the bending clamp being 1 mm and 2 mm. Measurement was carried out with respect to a bending angle of 135° of two left and right sides.

<Details of SEM Inspection of Graphite Film Surface>

The observation of the surface of a graphite film was carried out using a scanning electron microscope (SEM) (product name: manufactured by Hitachi, model S-4500) at an accelerating voltage of 5 kV. Several kinds of graphite films were cut into pieces of 5 mm×5 mm, and fixed on an aluminum stage having a diameter of 15 mm with an electrically conductive tape. The stage is regulated and set to give a height of 36 mm. The accelerating voltage was regulated to be 5 eV, and observation with a high magnification mode at 400× was carried out. The working distance was regulated to be 8 mm, and then the brightness, the contrast and the focus were adjusted. Thus, photographing was carried out such that the wrinkle of the graphite film surface can be observed. The image was captured at 640×480.

<Image Processing of SEM Inspection Image on Graphite Film Surface>

Image processing of the image obtained by SEM inspection of the graphite film surface was carried out using a general-purpose image processing soft (product name: NANO HUNTER NS2K-PRO/LT) available from NANO System Corporation. With respect to details of the image processing, the SEM image was first incorporated into the image processing program, and the density measurement was carried out. The maximum value (maximum: 255) and the minimum value (0) measured with the density measurement were confirmed, and the threshold of the binarization was determined according to the following formula.

$$\text{Threshold} = (\text{maximum value} - \text{minimum value}) \times 0.62 \quad (1)$$

Next, the SEM image was binarized with the threshold determined according to the above formula. In the binarization processing, a region revealing brighter than a certain threshold is whitened, while a region revealing darker than a certain threshold is blackened.

Subsequently, the binarized image was thinned. In the thinning processing, the whitened portion in the binarized image is converted in a line width of 1.

The area of the white region of the image derived by the processing as described above was measured.

<Production of Graphite Composite Film>

Composite with PET Tape

Figure 12:
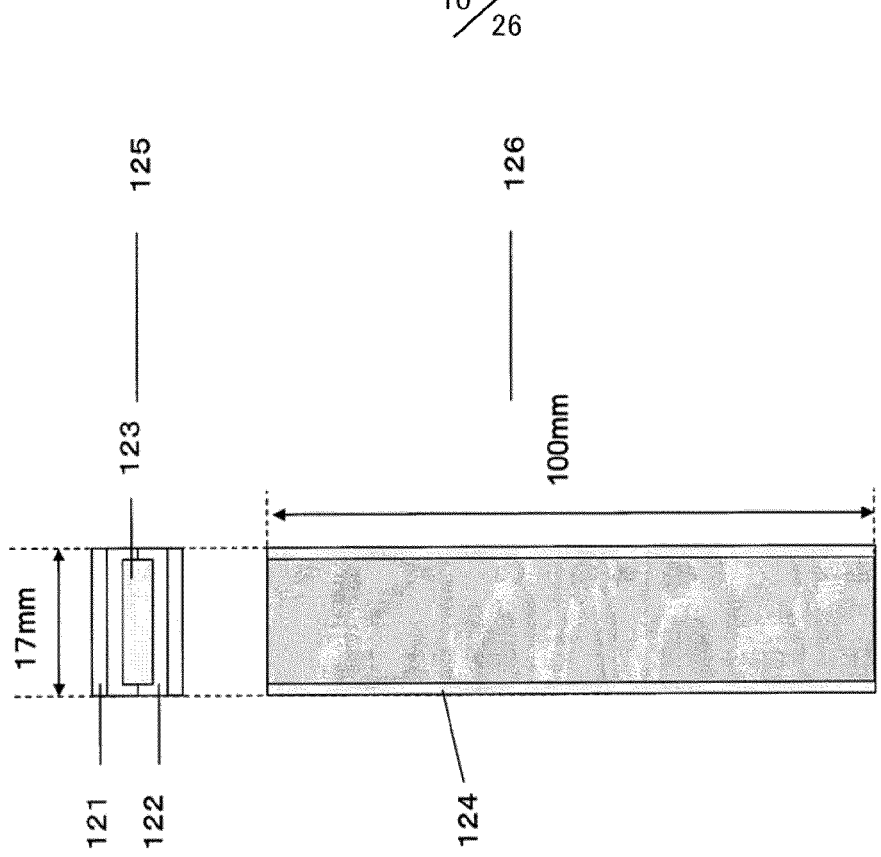
FIG. 12 shows a view illustrating a composite with a PET tape.

A PET film was formed on both faces of a graphite film via an acrylic adhesive material. Specifically, as shown in FIG. 12, a 15×100 mm graphite film and a 17×100 mm PET tape (manufactured by Teraoka Seisakusho Co. Ltd., 631S#12) were pasted with a laminating machine. In this step, pasting was carried out with 1 mm of the PET tape extending out from both two ends of the graphite film.

Composite with Virtual Flexible Print Wiring Plate

Figure 13:
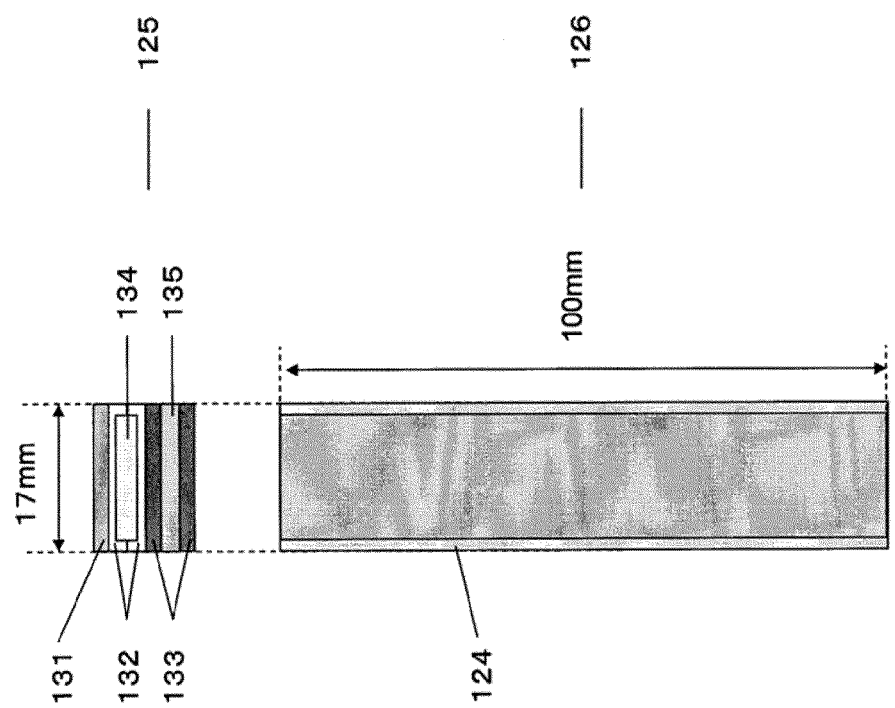
FIG. 13 shows a view illustrating a composite with a flexible print wiring plate.

A graphite film was combined with a flexible print wiring plate via an adhesive material. Specifically, a 15×100 mm graphite film was combined with a 17×100 mm PET tape (manufactured by Teraoka Seisakusho Co., Ltd., 631S#12) using a 17×100 mm adhesive material (manufactured by Teraoka Seisakusho Co., Ltd., 707) so as to enclose the same, as shown in FIG. 13, and was laminated with a virtual model of flexible board constituted with a 12.5 μm polyimide film (manufactured by Kaneka Corporation, Apical AH) and a 35 μm copper foil using a laminating machine.

<MIT Folding Endurance Test of Composite>

The composite of the PET tape and graphite, and the composite with the flexible print wiring plate were evaluated using a MIT folding endurance tester. A MIT flex resistant fatigue testing machine model D manufactured by TOYO SEIKI Co., Ltd. was used for measurement with a test load of 100 gf (0.98 N), at a rate of 90 times/min, and a curvature radius R of the bending clamp being 1 mm, with a bending angle of 90° of left and right sides. The bent portions after flex of 50, 100, 1,000, 5,000, 10,000, 50,000, 100,000, and 200,000 times were visually observed, and the numbers of the bent portion kept without alteration are shown in Table. It should be noted that states in which exfoliation from between the graphite layers was found, in which the PET tape was loosen, and the like were decided as "alteration found", while the states in which seams (including color change) were found corresponding to the flex at the bent portion were decided as "alteration not found".

<Evaluation of Cooling Performance After Seam Folding>

Deterioration of thermal diffusivity before and after seam folding of the graphite was evaluated.

With respect to the seam folding, specifically, when R at the bent portion is 1, a 20×100 mm graphite film was produced, and a portion from the top to 20 mm away therefrom was folded, and a weight of 500 g was places. In addition, the film was further folded from the same portion in a opposing direction, and a weight of 500 g was similarly placed, which operation was counted as suggesting number of times of seam folding being once. When R is 0.5, a wire having a diameter of 0.5 mm was inserted into the portion, and similar folding operation was carried out.

Figure 14:
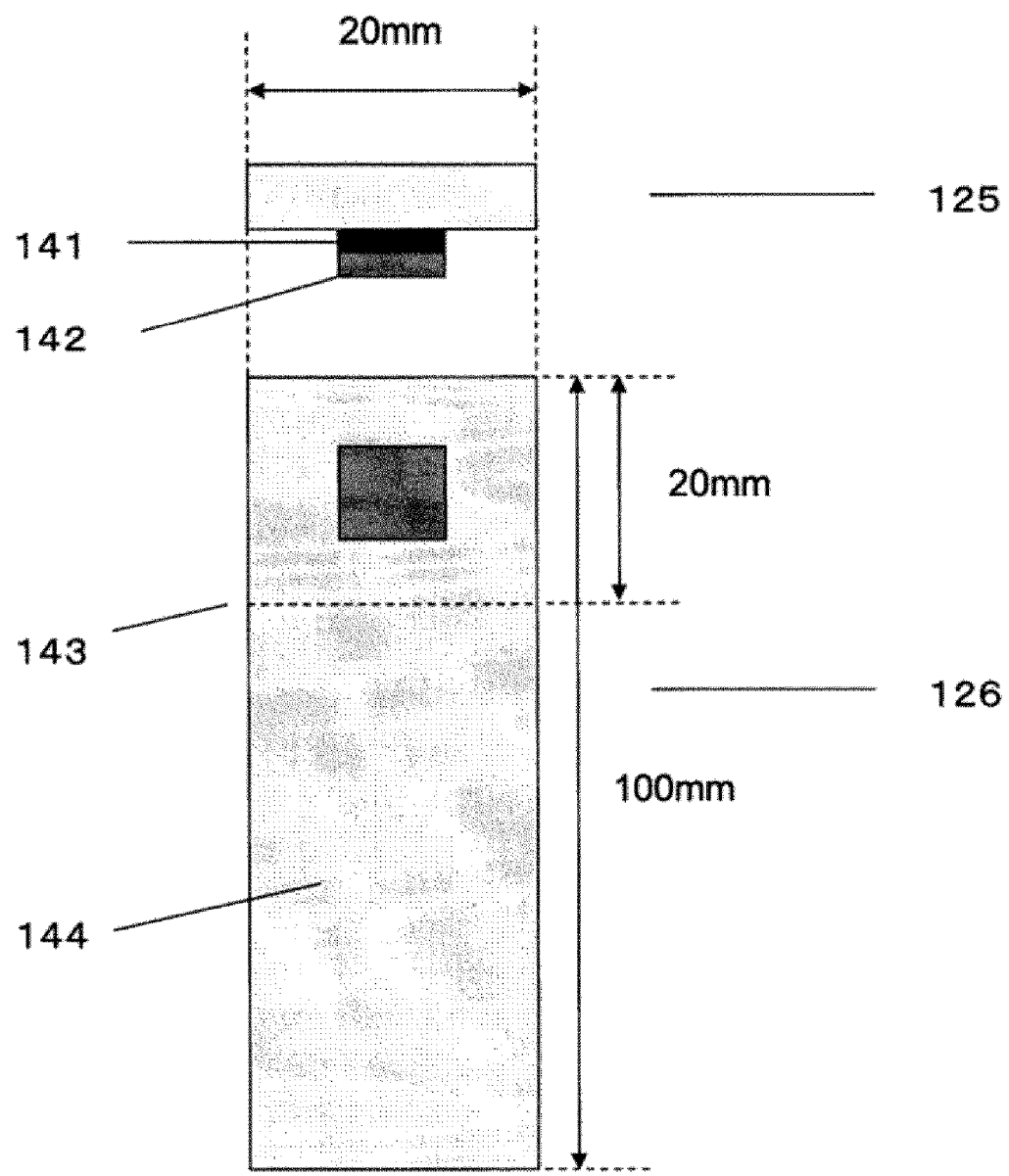
FIG. 14 shows a view illustrating a method of evaluating a cooling performance after seam folding.

For evaluation of the thermal diffusivity, a 1 cm square ceramic heater (manufactured by SAKAGUCHI E.H VOC Corp.) was connected to the graphite film before or after seam folding as a heat generator, as shown in FIG. 14. For connection, a high thermal diffusivity silicone rubber sheet (manufactured by GELTEC, 6.5 W/mK) for use in contacting a heat sink with CPU was employed. Additionally, the room temperature was regulated to 22.5±0.5° C., and the measurement was carried out while covering the measurement region by foamed polystyrene such that the cooling effect by virtue of convection (wind) could kept constant. The wattage of the electric power supply was kept at 1 W to carry out the measurement. When a steady state (heater temperature being no higher than ±1° C.) was observed, the heater temperature was measured. The measurement with the heater was carried out using a thermometer for reading the infrared ray generated from the heat generator. In practice, Thermotracer TH9100MV/WV (manufactured by NEC San-ei Instruments, Ltd.) was used to measure the heater temperature. Higher temperature of the heater would indicate deterioration of the cooling performance of the graphite.

The thickness, the percentage of the white region after the surface SEM image processing, the number of times in the MIT test, the coefficient of thermal diffusivity, density, and the like of the of the graphite film used in Examples and Comparative Examples determined by the present inventors or applicants of the present invention are summarized in Table 1. It should be noted that the graphite production method of Reference Examples shown in Table 1 were estimated according to known bibliographies.

TABLE 1

| | Graphite Film | Source Material Film | Method for Manufacturing | Graphitization Max Temp. (°C.) | Pressure During Graphitizing (g/cm²) | Number of Laminated Graphite film (pieces) | Thickness After Compression (μm) | Ratio of White Region After Surface SEM Image Processing (%) |
|---|---|---|---|---|---|---|---|---|
| Example 1 | Graphite film 1 | Polyimid A | Polymer degradation method (electric heating) | 3000 | 30 | 100 | 40 | 2.5 |
| Example 2 | Graphite film 2 | Polyimid B | Polymer degradation method (electric heating) | 3000 | 30 | 100 | 25 | 2.8 |
| Example 3 | Graphite film 3 | Polyimid A | Polymer degradation method (electric heating) | 2900 | 30 | 100 | 41 | 3.2 |
| Example 4 | Graphite film 4 | Polyimid A | Polymer degradation method (electric heating) | 2800 | 30 | 100 | 42 | 3.4 |
| Example 5 | Graphite film 5 | Polyimid A | Polymer degradation method (electric heating) | 3000 | 30 | 20 | 39 | 2.3 |
| Example 6 | Graphite film 6 | Polyimid A | Polymer degradation method (atmospheric heating) | 3000 | 30 | 100 | 49 | 7.9 |
| Comparative Example 1 | Graphite film 7 | Polyimid A | Polymer degradation method (electric heating) | 2600 | 30 | 100 | 46 | 0.9 |
| Comparative Example 2 | Graphite film 8 | Polyimid A | Polymer degradation method (electric heating) | 3000 | 30 | 1 | 37 | 0.4 |
| Comparative Example 3 | Graphite film 9 | Polyimid A | Polymer degradation method (electric heating) | 3000 | 30 | 5 | 38 | 0.8 |
| Comparative Example 4 | Graphite film 10 | Polyimid A | Polymer degradation method (electric heating) | 3000 | 120 | 100 | 37 | 0.9 |
| Comparative Example 5 | Graphite film 11 | Polyimid A | Polymer degradation method (electric heating) | 3000 | 3 | 100 | 43 | 8.6 |
| Reference Example 1 | PGS(70 μm product) | KAPTON75 | Polymer degradation method | — | — | — | 70 | 8.9 |
| Reference Example 2 | PGS(100 μm product) | KAPTON75 | Polymer degradation method | — | — | — | 100 | 9.4 |

| | Density After compression (g/cm³) | Coefficient of Thermal Diffusivity (×10⁻⁴ m²/s) | Flex resistance properties Single Film R = 1 135 deg. | Flex resistance properties Single Film R = 2 135 deg. | Flex resistance properties Composite Film PET Sandwich R = 1 90 deg. | Flex resistance properties Composite Film Composite with Flexible Plate 90 deg. | Evaluation of heat conductivity after seam folding, 10 times Difference of heater Temp. between before and after seam folding R = 0 | Evaluation of heat conductivity after seam folding, 10 times Difference of heater Temp. between before and after seam folding R = 0.5 |
|---|---|---|---|---|---|---|---|---|
| Example 1 | 1.75 | 9.1 | 98342 times | 104352 times | 100000 times or more | 50000 times or more | 0.2° C. | 0.0° C. |
| Example 2 | 1.75 | 9.2 | 78291 times | 92923 times | 100000 times or more | 50000 times or more | 0.3° C. | 0.2° C. |
| Example 3 | 1.65 | 8.8 | 40030 times | 50899 times | 50000 times or more | 10000 times or more | 0.8° C. | 0.1° C. |
| Example 4 | 1.60 | 8.3 | 24533 times | 43349 times | 50000 times or more | 10000 times or more | 1.5° C. | 0.2° C. |
| Example 5 | 1.80 | 9.3 | 14899 times | 12398 times | 50000 times or more | 5000 times or more | 2.0° C. | 0.1° C. |
| Example 6 | 1.49 | 7.2 | 10006 times | 11239 times | 50000 times or more | 5000 times or more | 2.1° C. | 0.1° C. |
| Comparative Example 1 | 2.00 | 3.2 | 8 times | 9 times | 50 times or less | 50 times or less | Unmeasurable | Unmeasurable |
| Comparative Example 2 | 2.10 | 10.1 | 5 times | 8 times | 50 times or less | 50 times or less | Unmeasurable | Unmeasurable |
| Comparative Example 3 | 2.05 | 9.8 | 33 times | 17 times | 50 times or less | 50 times or less | Unmeasurable | Unmeasurable |
| Comparative Example 4 | 2.00 | 10.3 | 278 times | 346 times | 1000 times or more | 1000 times or more | Unmeasurable | Unmeasurable |
| Comparative Example 5 | 1.45 | 8.2 | 3420 times | 4239 times | 10000 times or more | 1000 times or more | Unmeasurable | Unmeasurable |
| Reference Example 1 | 1.20 | 7.2 | 1176 times | 2040 times | 10000 times or more | 5000 times or more | 2.3° C. | 0.1° C. |
| Reference Example 2 | 0.90 | 7.0 | 342 times | 453 times | 10000 times or more | 5000 times or more | 3.4° C. | 1.1° C. |

(*Source materials of Reference Examples ware extructed from Documents.)

Example 1

Figure 15:
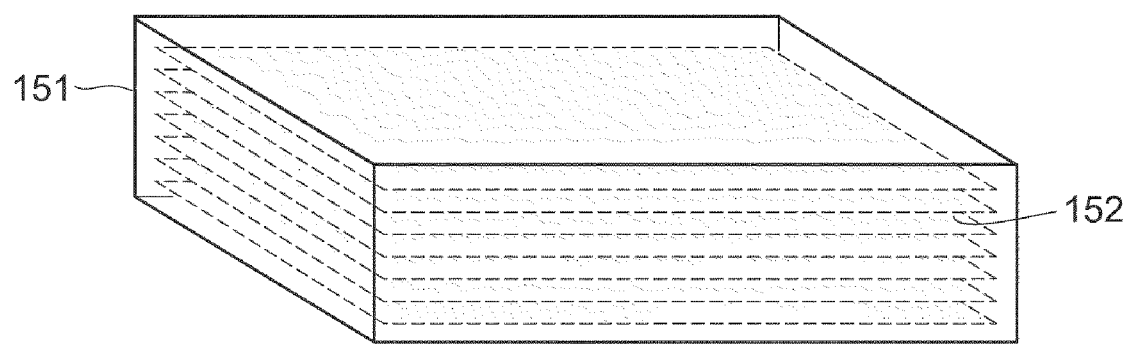
FIG. 15 shows a view illustrating a method of holding a source material film by a vessel A.
Figure 16:
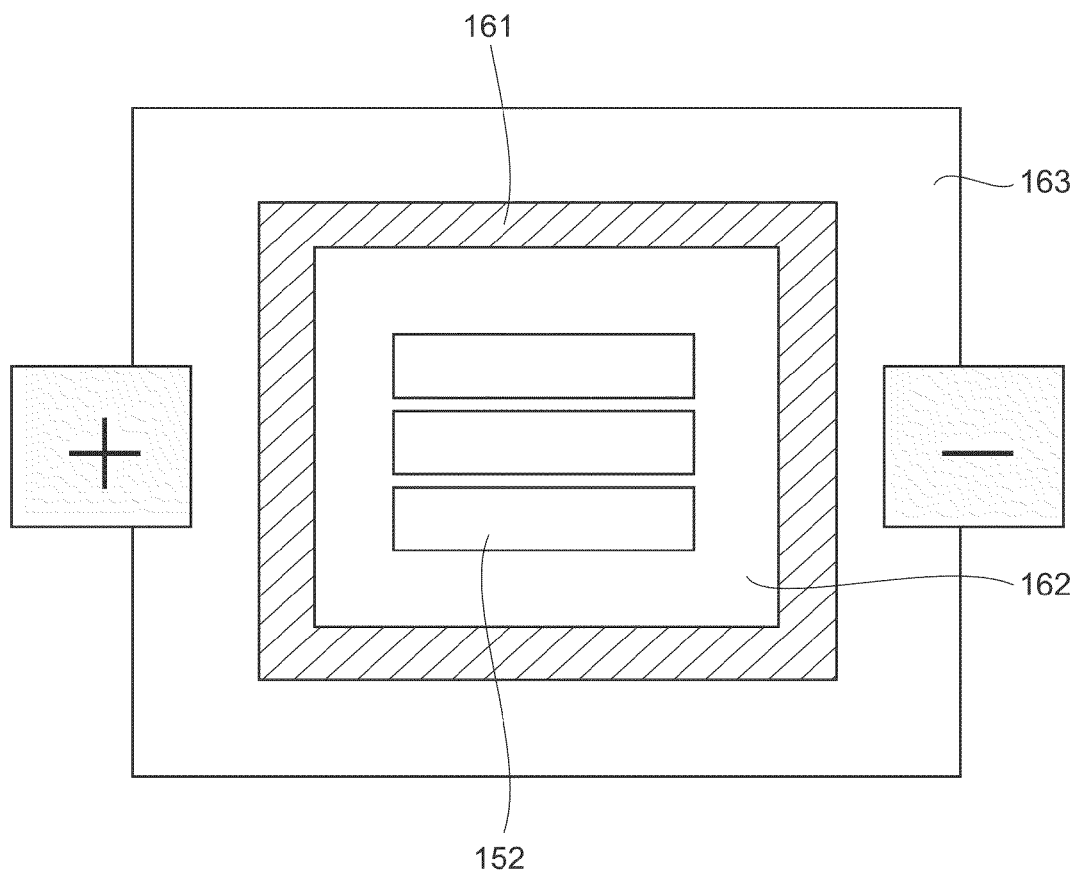
FIG. 16 shows a view illustrating a method of holding by a vessel A and a vessel B, and a method of electrification.
Figure 17:
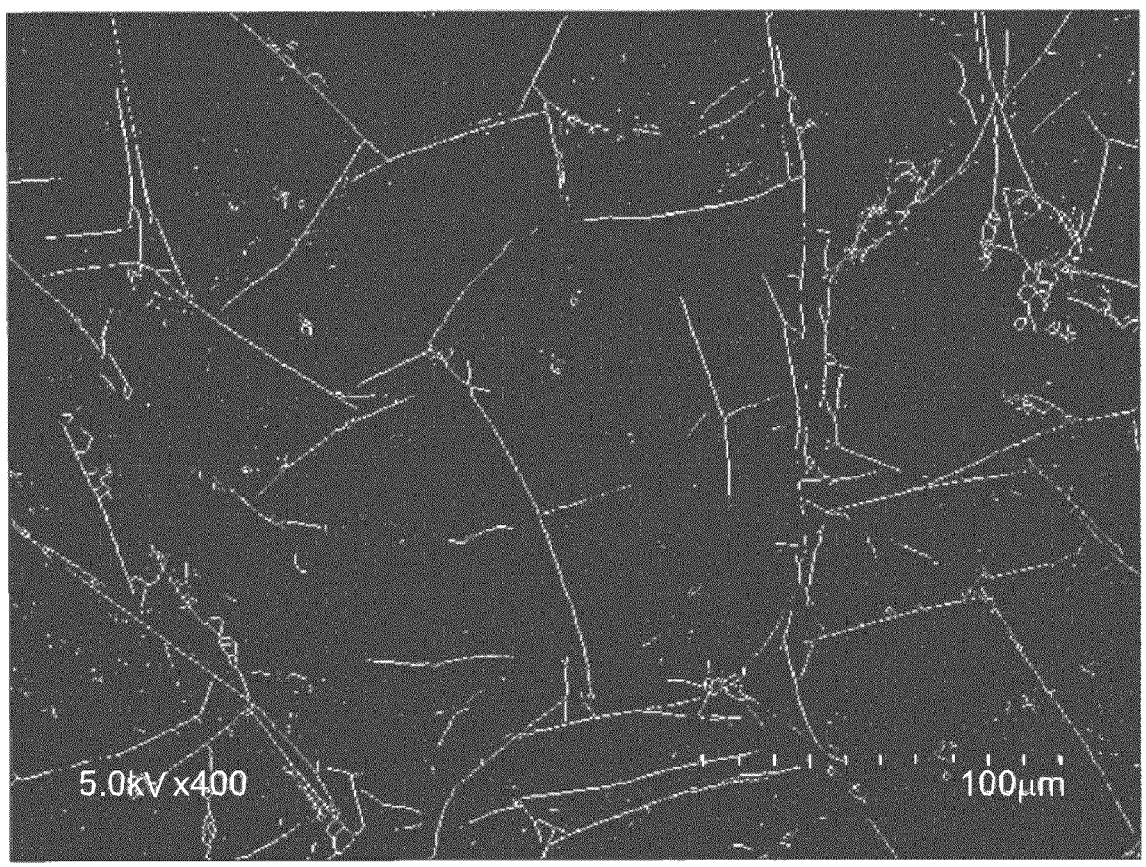
FIG. 17 shows an SEM photograph of the surface after image processing in Example 1.
Figure 18:
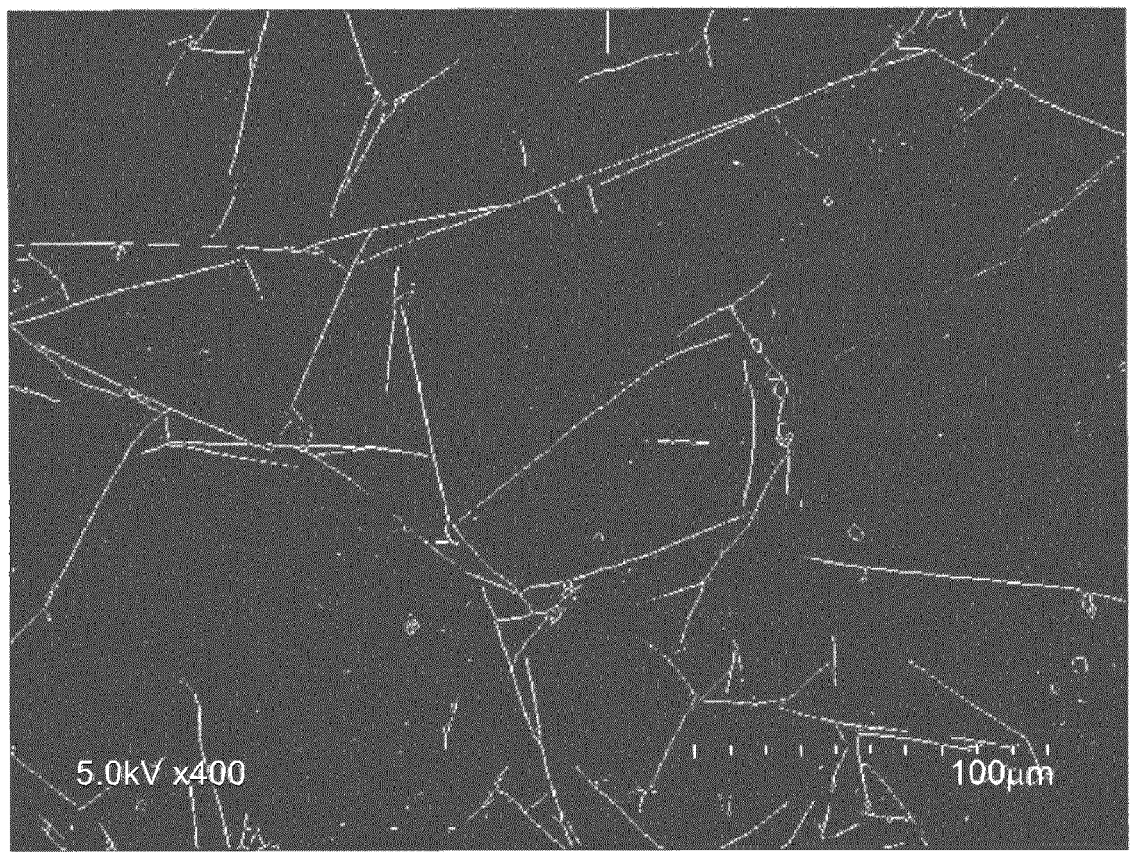
FIG. 18 shows an SEM photograph of the surface after image processing in Example 2.
Figure 19:
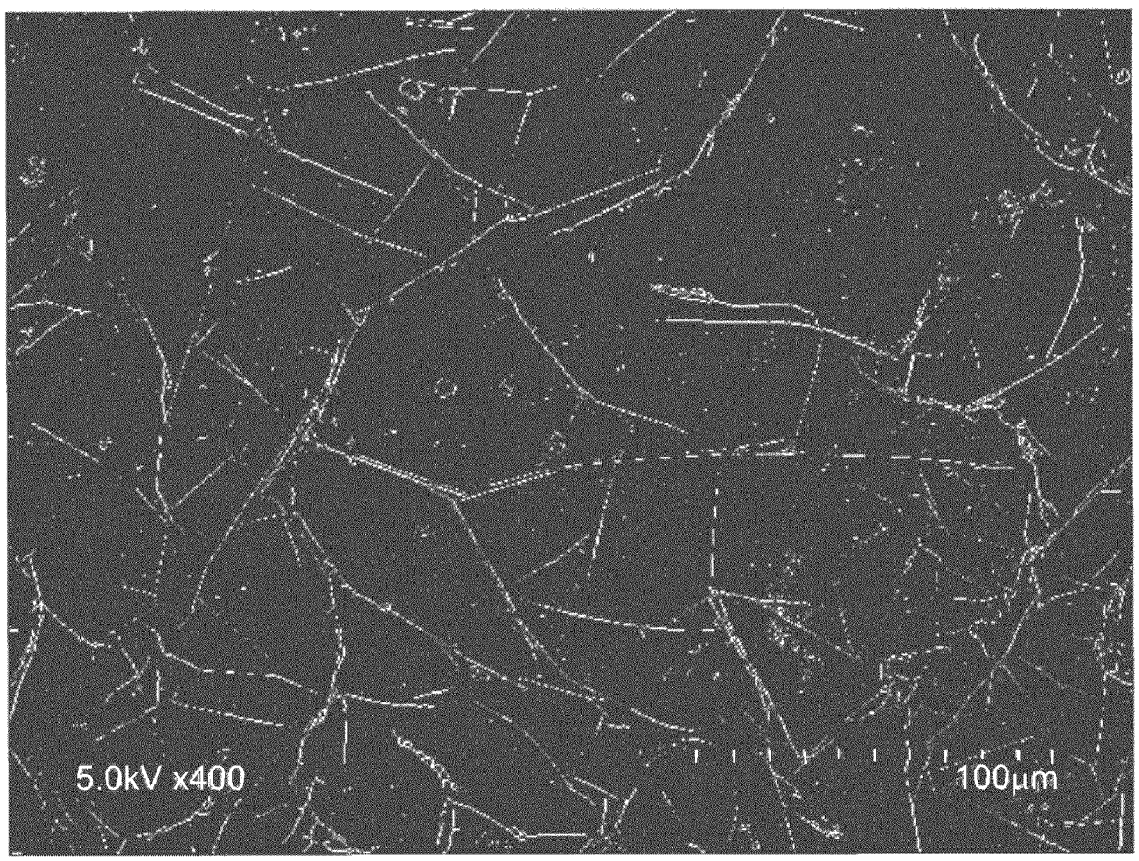
FIG. 19 shows an SEM photograph of the surface after image processing in Example 3.
Figure 20:
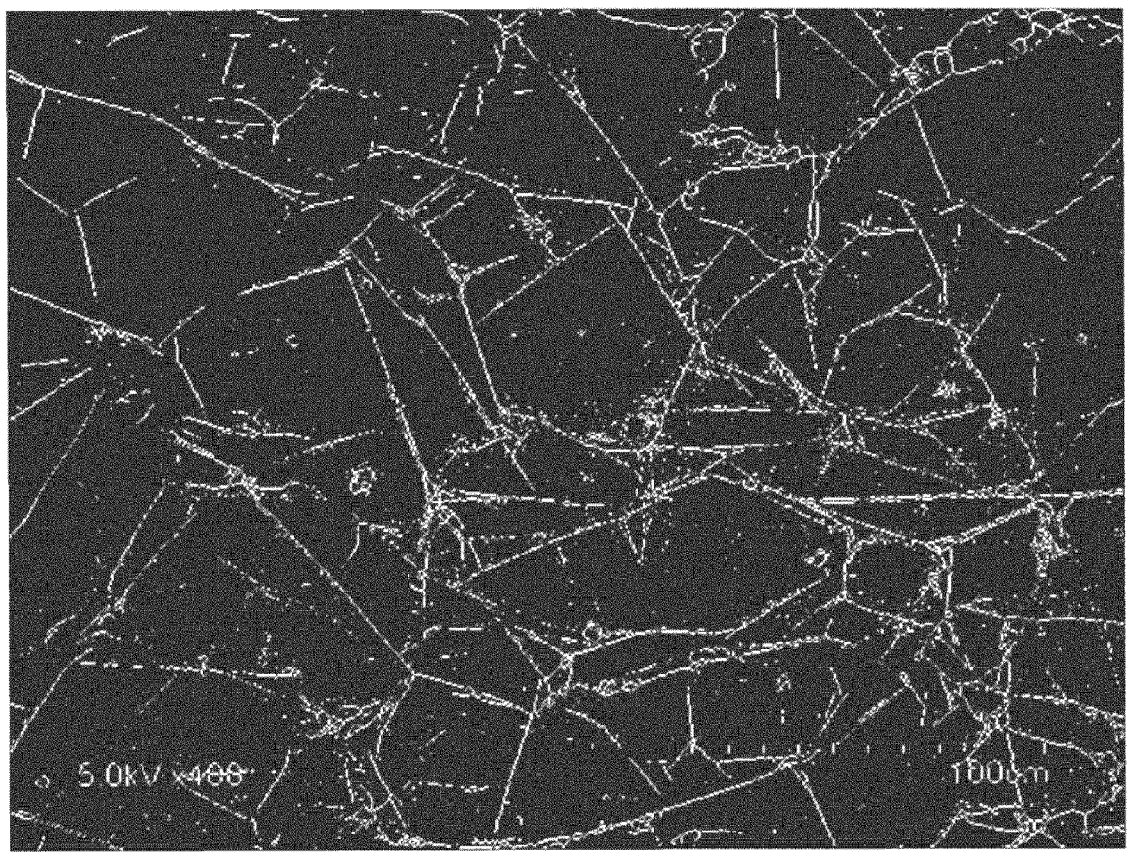
FIG. 20 shows an SEM photograph of the surface after image processing in Example 4.
Figure 21:
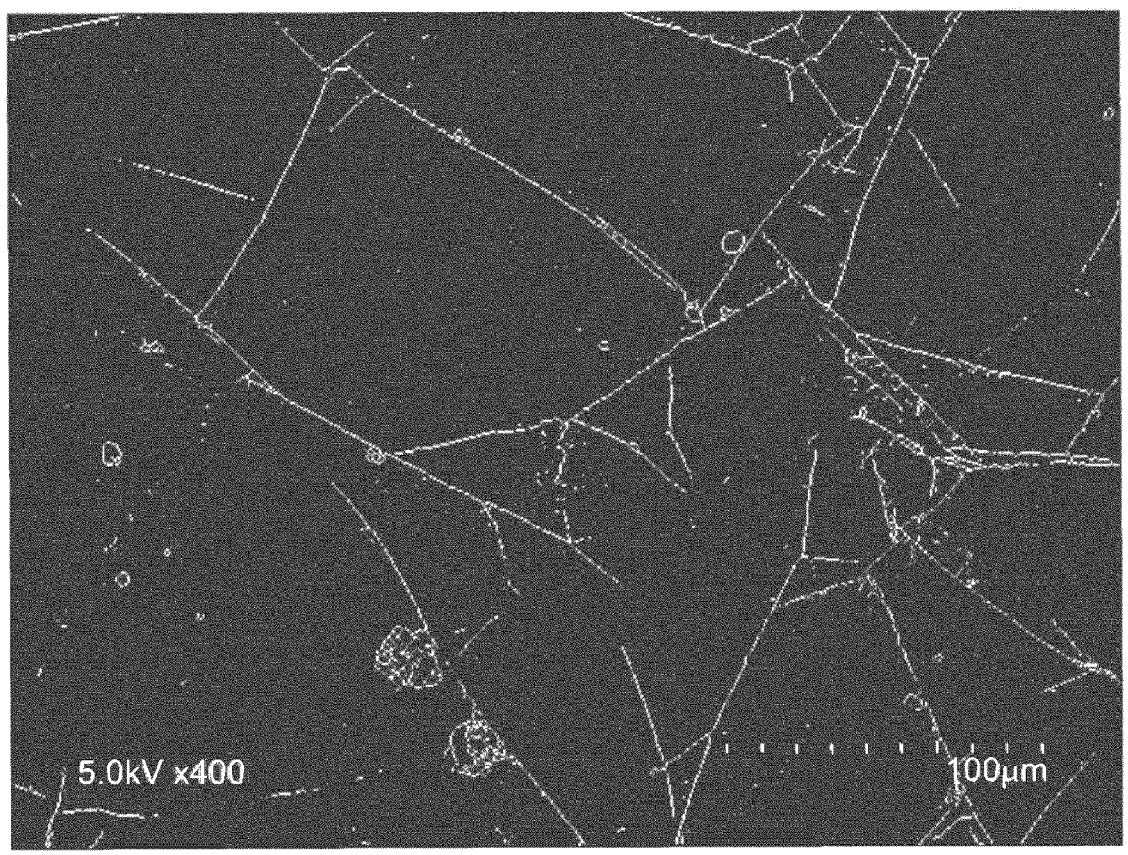
FIG. 21 shows an SEM photograph of the surface after image processing in Example 5.
Figure 22:
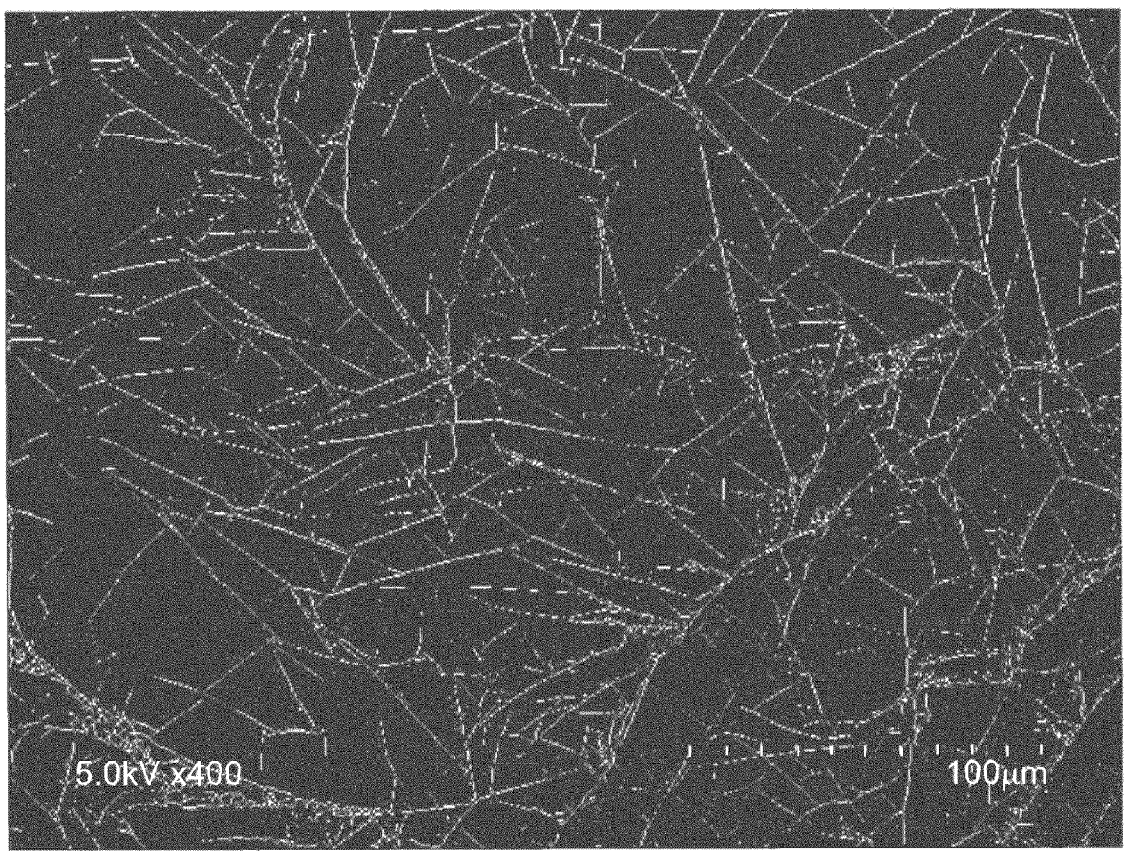
FIG. 22 shows an SEM photograph of the surface after image processing in Example 6.
Figure 23:
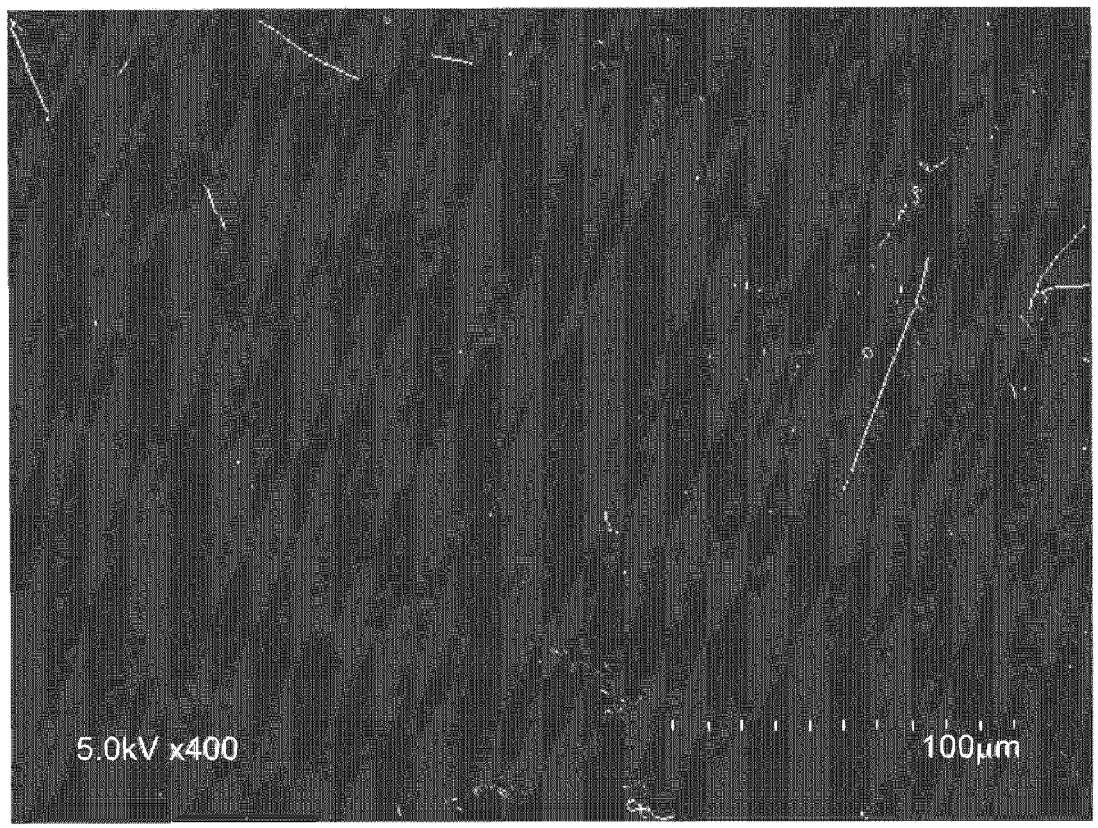
FIG. 23 shows an SEM photograph of the surface after image processing in Comparative Example 1.
Figure 24:
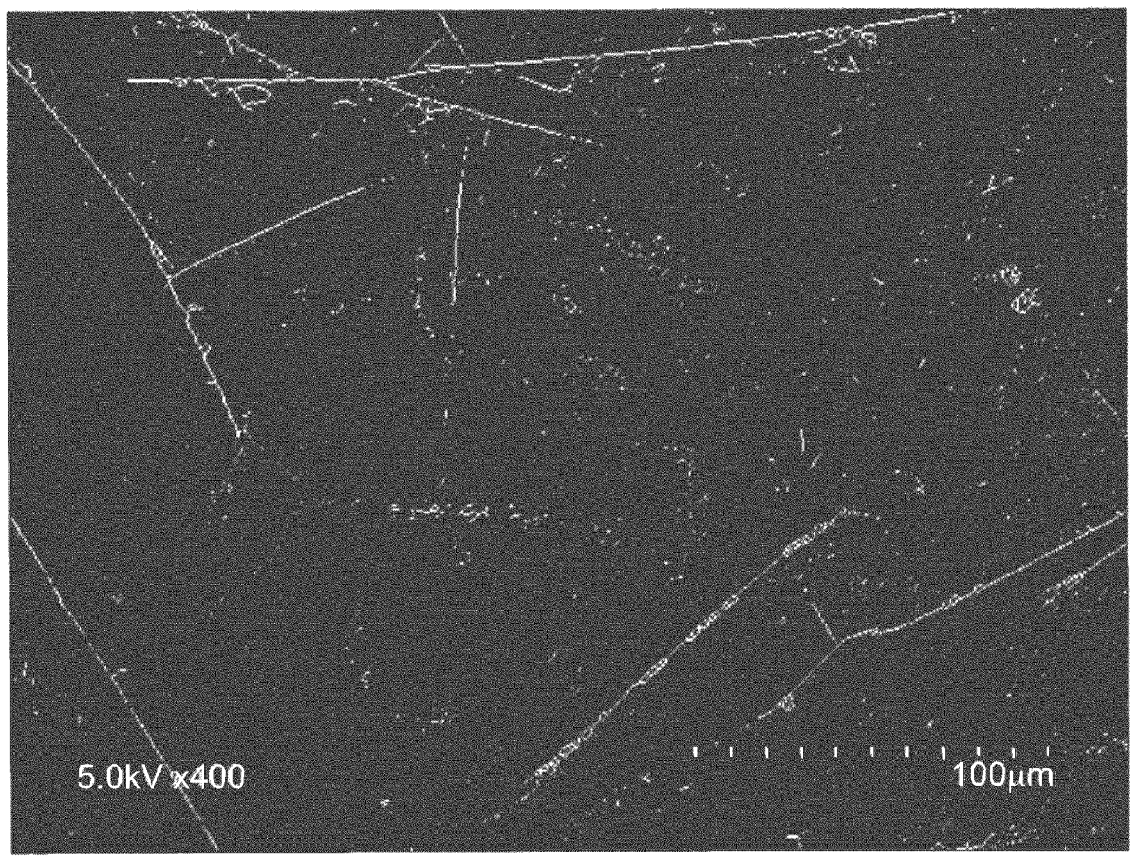
FIG. 24 shows an SEM photograph of the surface after image processing in Comparative Example 2.
Figure 25:
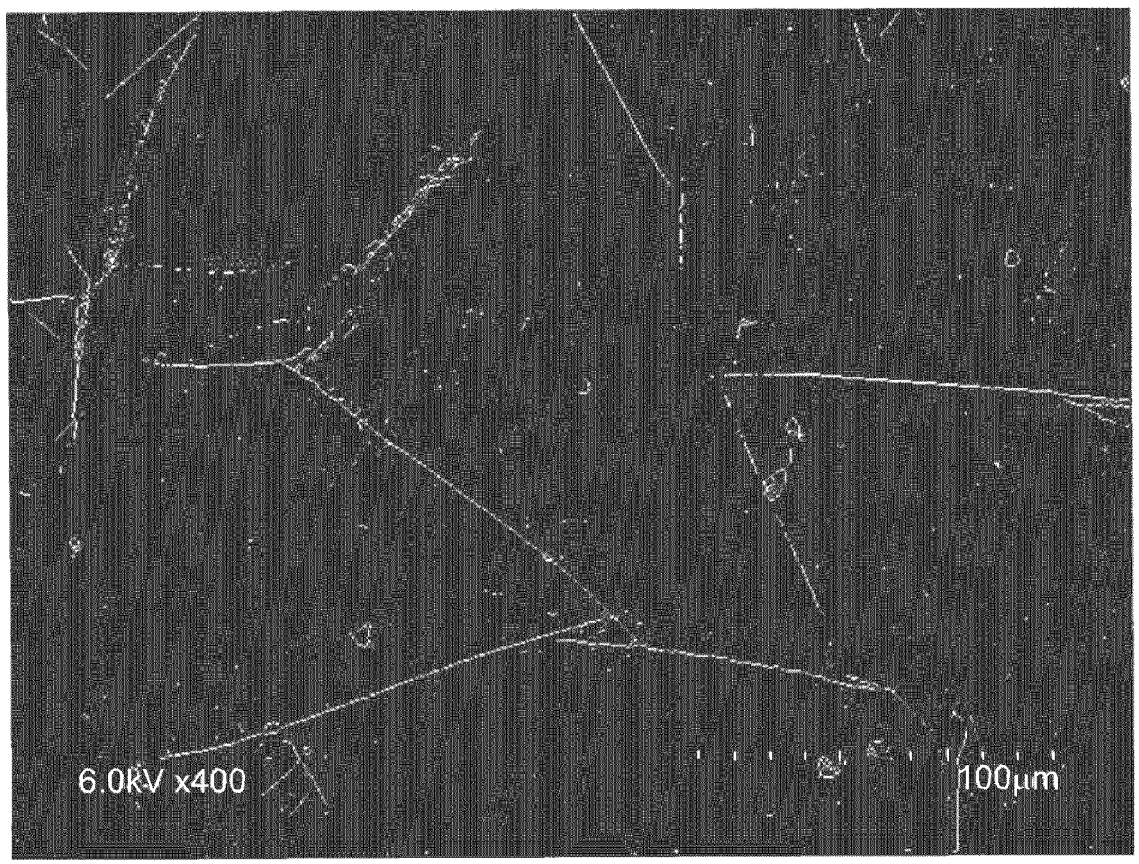
FIG. 25 shows an SEM photograph of the surface after image processing in Comparative Example 3.
Figure 26:
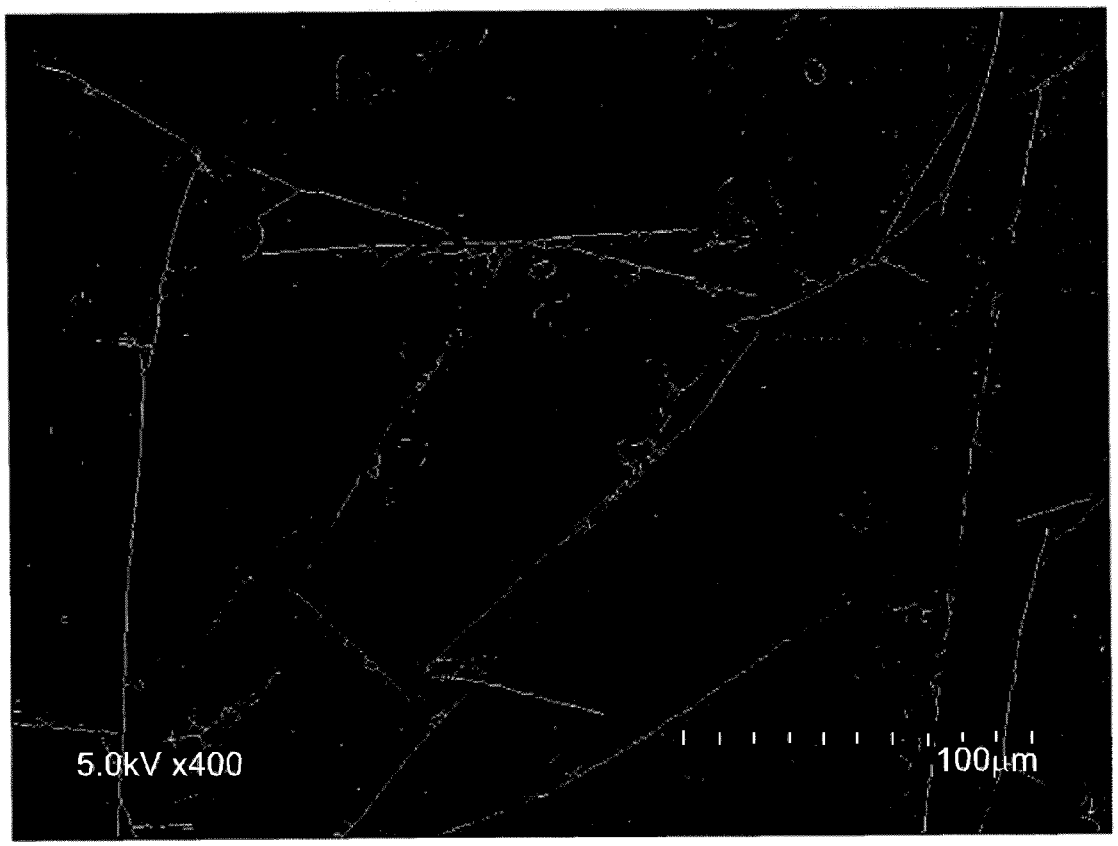
FIG. 26 shows an SEM photograph of the surface after image processing in Comparative Example 4.
Figure 27:
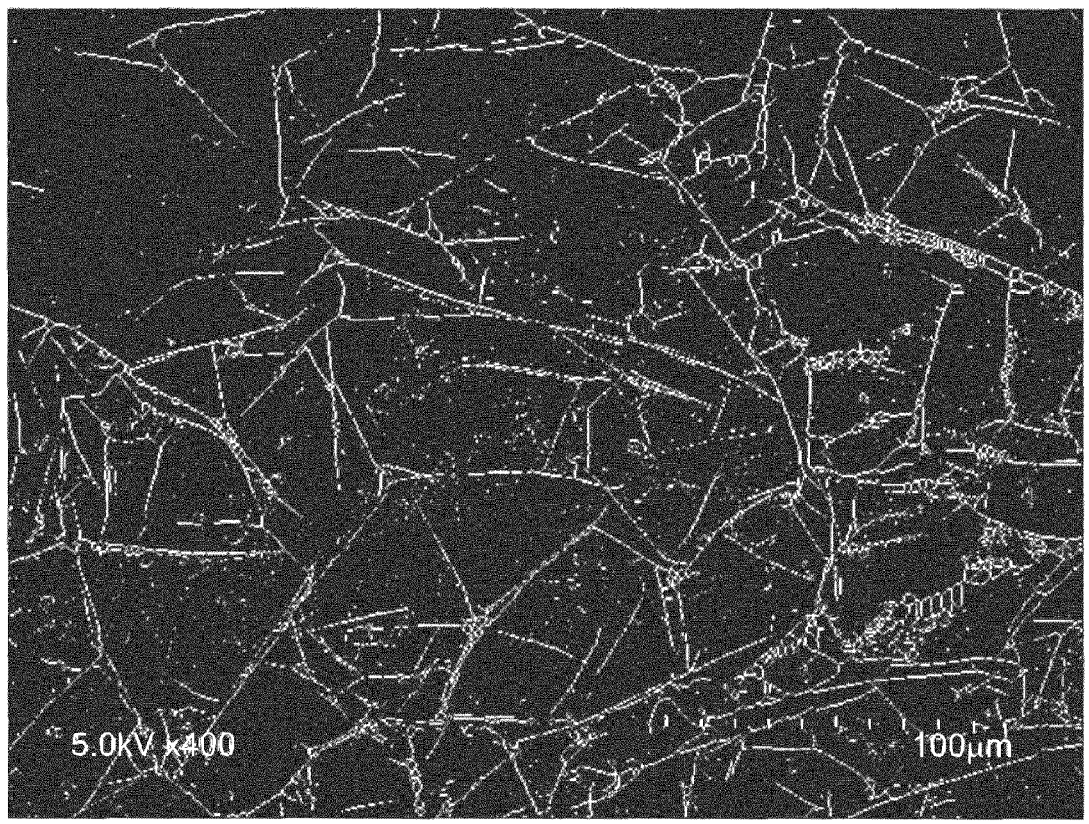
FIG. 27 shows an SEM photograph of the surface after image processing in Comparative Example 5.
Figure 28:
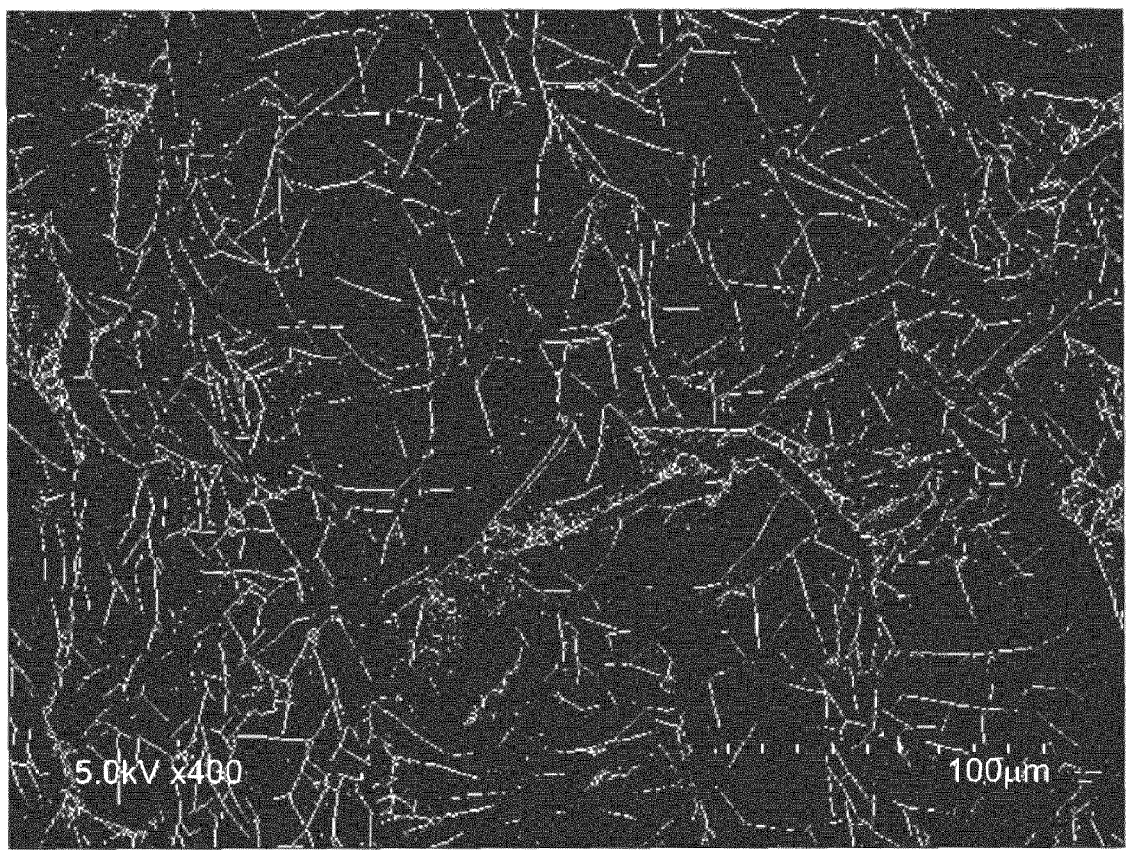
FIG. 28 shows an SEM photograph of the surface after image processing in Reference Example 1.
Figure 29:
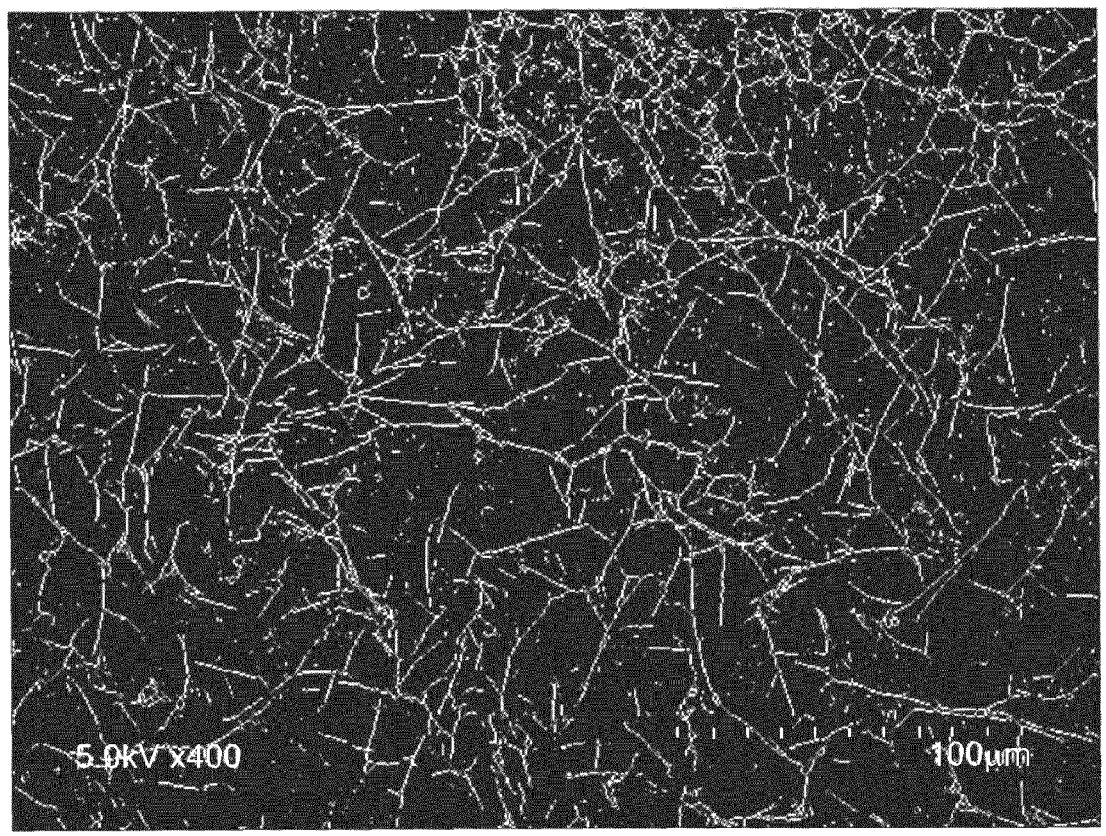
FIG. 29 shows an SEM photograph of the surface after image processing in Reference Example 2.

A source material film laminate in which 100 pieces of carbonized films A (400 cm² (length: 200 mm×width: 200 mm) obtained by a carbonizing treatment were laminated was sandwiched with platy smooth graphites having a length of 270 mm×a width of 270 mm×a thickness of 3 mm from both top and bottom, and held in a black lead vessel having a length 300 mm×a width of 300 mm×a thickness of 60 mm (vessel A) as shown in FIG. 15. A platy graphite as a weight was placed on the laminate so as to allow the pressure of 30 g/cm² to be applied on the film, and a graphitization treatment was permitted by elevating the temperature to 3,000° C. using a graphitization furnace. The vessel A was held directly in an electrically accessible vessel B as schematically shown in FIG. 16, and around the outer periphery of the vessel A was covered with carbon powders (filling carbon powders with vessel A and vessel B). As shown in FIG. 16, electric heating was conducted by applying a voltage in the state in which carbon powders were covered around the outer periphery of the vessel B until the temperature of the vessel A reaches 3,000° C. After cooling to a room temperature, the graphite after the heat treatment was compressed by a veneer press method to obtain a graphite film 1. Using the graphite film 1, various physical properties shown in Table 1 of the simplicial graphite film and the composite were determined.

Example 2

A graphite film 2 was produced in a similar manner to the graphite 1 except that the carbonized film B was used as a source material. Using the graphite film 2, various physical properties shown in Table 1 of the simplicial graphite film and the composite were determined.

Example 3

A graphite film 3 was produced in a similar manner to the graphite 1 except that the graphitization treatment was carried out by elevating the temperature to 2,900° C. with a graphitization furnace. Using the graphite film 3, various physical properties shown in Table 1 of the simplicial graphite film and the composite were determined.

Example 4

A graphite film 4 was produced in a similar manner to the graphite 1 except that the graphitization treatment was carried out by elevating the temperature to 2,800° C. with a graphitization furnace. Using the graphite film 4, various physical properties shown in Table 1 of the simplicial graphite film and the composite were determined.

Example 5

A graphite film 5 was produced in a similar manner to the graphite 1 except that twenty pieces of the carbonized film A obtained by the carbonization treatment were laminated. Using the graphite film 5, various physical properties shown in Table 1 of the simplicial graphite film and the composite were determined.

Example 6

A graphite film 6 was produced in a similar manner to the graphite 1 except that a heater of ohmic resistance heating system was used, and the vessel A was heated to 3,000° C. in an argon gas stream. Using the graphite film 6, various physical properties shown in Table 1 of the simplicial graphite film and the composite were determined.

Comparative Example 1

A graphite film 7 was produced in a similar manner to the graphite 1 except that the graphitization treatment was carried out by elevating the temperature to 2,600° C. with a graphitization furnace. Using the graphite film 7, various physical properties shown in Table 1 of the simplicial graphite film and the composite were determined.

Comparative Example 2

A graphite film 8 was produced in a similar manner to the graphite 1 except that the carbonized film A obtained by the carbonization treatment was not laminated but a single piece was set. Using the graphite film 8, various physical properties shown in Table 1 of the simplicial graphite film and the composite were determined.

Comparative Example 3

A graphite film 9 was produced in a similar manner to the graphite 1 except that five pieces of the carbonized film A obtained by the carbonization treatment were laminated. Using the graphite film 9, various physical properties shown in Table 1 of the simplicial graphite film and the composite were determined.

Comparative Example 4

A graphite film 10 was produced in a similar manner to the graphite 1 except that a platy graphite as a weight was placed on the laminate so as to allow the pressure of 120 g/cm² to be applied on the source material film laminate. Using the graphite film 10, various physical properties shown in Table 1 of the simplicial graphite film and the composite were determined.

Comparative Example 5

A graphite film 11 was produced in a similar manner to the graphite 1 except that a platy graphite as a weight was placed on the laminate so as to allow the pressure of 3 g/cm² to be applied on the source material film laminate. Using the graphite film 11, various physical properties shown in Table 1 of the simplicial graphite film and the composite were determined.

Reference Example 1

Using a generally available PGS graphite film "EYGS182310" manufactured by Matsushita Electric Industrial Co., Ltd., various physical properties shown in Table 1 of the simplicial graphite film and the composite were determined.

Reference Example 2

Using a generally available PGS graphite film "EYGS182310" manufactured by Matsushita Electric Industrial Co., Ltd., various physical properties shown in Table 1 of the simplicial graphite film and the composite were determined.

<MIT Folding Endurance Test of Simplicial Graphite Film>

<R=2, 135°>

The number of foldings according to the MIT test on Examples 1 to 6 was 10,000 times or more, which indicated a very higher flex resistance as compared with Comparative Examples 1 to 7 and Reference Examples 1 to 2.

Particularly, a significantly higher flex resistance with the number of 100,000 times or more was indicated in Example 1, and this results from uniform heating of the source material film since the graphitization was carried out with an electric heating method.

In addition, since the temperature was elevated to 3,000° C., the graphite layers grown in the planer direction, whereby the mechanical properties in the planer direction were improved.

Furthermore, as a result of the number of the laminated pieces of the source material film being 100, excessive heating in an even manner could be prevented, and generation of the gas to yield the foaming state could be retarded, to enable suppression of invasion of impurities.

In addition, since the balance between the applied load and the number of the laminated pieces of the source material film was appropriate, the extent of foaming was suppressed, and the growth of the graphite layer in the planer direction was accelerated.

Moreover, the polymer film used as the source material having a molecular orientation suited for obtaining a graphite that was excellent in the flex resistance would be one factor for such events.

Accordingly, due to a synergistic effect of such several factors that improve the flex resistance, a graphite film that is extremely excellent in the flex resistance could be obtained in Example 1 compared with Examples 3 to 6, Comparative Examples 1 to 5, and Reference Examples 1 to 2.

In Example 2, a graphite film having a thickness of 25 μm was obtained since a source material film having a smaller thickness than Example 1 was used. Thus, the flex resistance of the film was inferior to the film of Example 1 although the extent was just a small.

The flex resistance of the graphite films of Examples 3 to 4 was inferior as compared with that of Example 1 on the ground that the temperature was not elevated just to 2,900° C. and 2,800° C. in Examples 3 and 4, whereby growth of the graphite layers in the planer direction was insufficient as compared with Example 1. However, although Examples 3 to 4 exhibited somewhat inferior results compared with Examples 1 to 2, graphite films that are excellent in the flex resistance as compared with Comparative Examples 1 to 5 and Reference Examples 1 to 2 were obtained since other baking conditions were appropriately set.

The flex resistance of the graphite film of Example 5 was inferior as compared with that of Example 1 on the ground that the number of the laminated pieces of the source material film was small, whereby the film was heated in an even manner excessively, gas generation could not be retarded, and invasion of impurities could not be suppressed, as compared with Example 1. However, although Example 5 exhibited somewhat inferior results compared with Example 1, a graphite film that is excellent in the flex resistance as compared with Comparative Examples 1 to 5 and Reference Examples 1 to 2 was obtained since other baking conditions were appropriately set.

The flex resistance of the graphite film of Example 6 was inferior as compared with that of Example 1 on the ground that the specimen was not evenly heated in Example 6 due to the atmospheric heating employed. However, although Example 6 exhibited somewhat inferior results compared with Example 1, a graphite film that is excellent in the flex resistance as compared with Comparative Examples 1 to 5 and Reference Examples 1 to 2 was obtained since other baking conditions were appropriately set.

On the other hand, Comparative Examples 1 to 6 exhibited significantly inferior flex resistance as compared with Examples 1 to 6.

The flex resistance was inferior in Comparative Example 1 as compared with Examples on the ground that graphitization did not proceed enough due to the maximum temperature as low as 2,600° C., and that sufficient foaming state could not be achieved since the temperature was not elevated to the temperature that allows the internal gas to be generated.

The flex resistance was inferior in Comparative Examples 2 and 3 as compared with Examples on the ground that the number of the laminated pieces of the source material films in graphitization was small. This would result from small number of the laminated pieces, whereby the film was heated in an even manner excessively, the gas generation could not be retarded, and invasion of impurities could not be suppressed.

The flex resistance was inferior in Comparative Example 4 as compared with Examples on the ground that the load placed in graphitization was too heavy, whereby foaming of the film in the thickness direction was suppressed, and the graphite layers were excessively grown in the planer direction.

The flex resistance was inferior in Comparative Example 5 as compared with Examples on the ground that the load placed in graphitization was too light, and thus, the growth of the graphite layers in the planer direction was insufficient, and the extent of foaming was too large.

Furthermore, significantly inferior flex resistance was exhibited in Reference Examples 1 to 2 as compared with Examples 1 to 4.

<R=1, 135°>

When the bending radius R was 1, a similar tendency was observed to the case in which R is 2, although the number of times of the flex was smaller. Thus, description of details is herein omitted.

<Percentage of White Region after Surface SEM Image Processing>

Images obtained by image processing of surface SEM photographs of Examples 1 to 6, Comparative Examples 1 to 5, and Reference Examples 1 to 2 are shown in FIG. 17 to FIG. 29.

The percentage of the white region after the surface SEM image processing of Examples 1 to 6 was in the range of not less than 2.3% and not greater than 7.9%, and thus foaming states found in graphite films that are excellent in the flex resistance could be ascertained.

In more detail, Examples 1 and 2 exhibited the percentage of 2.5% and 2.3%, respectively, suggesting particularly excellent flex resistance by virtue of very appropriate foaming states. This results from uniform heating of the source material film since the graphitization was carried out with an electric heating method.

In addition, since the temperature was elevated to 3,000° C., the graphite layers grown in the planer direction, whereby the mechanical properties in the planer direction were improved.

Furthermore, as a result of the number of the laminated pieces of the source material film being 100, excessive heating in an even manner could be prevented, and generation of the gas could be retarded, to enable suppression of invasion of impurities, whereby the graphite films that exhibit excellent flex resistance could be obtained.

In addition, as a result of the balance between the applied load and the number of the laminated pieces of the source material film being appropriate, the extent of foaming was suppressed, and the growth of the graphite layer in the planer direction was accelerated, whereby graphite films that are excellent in the flex resistance could be obtained.

Moreover, the polymer film used as the source material having a molecular orientation suited for obtaining a graphite that was excellent in the flex resistance would be one factor for such events.

Accordingly, due to a synergistic effect of such several factors that improve the flex resistance, a graphite film that has extremely appropriate foaming state could be obtained in Examples 1 to 2 compared with Examples 3 to 6, Comparative Examples 1 to 5, and Reference Examples 1 to 2.

The percentage of the white region after the surface SEM image processing was greater to some extent in Examples 3 and 4 as compared with Examples 1 and 2, on the ground that growth of the graphite layers in the planer direction was insufficient as a result of the maximum temperature being lower as compared with Examples 1 and 2. On the same ground, the number of times of the MIT test results was smaller as compared with Examples 1 and 2.

In Example 5, the percentage of the white region after the surface SEM image processing was smaller to some extent as compared with Examples 1 and 2. This would result from small number of the laminated pieces of the source material film, leading to a small extent of foaming, as well as a large domain, since the film was heated in an even manner excessively, gas generation could not be retarded, and invasion of impurities could not be suppressed, as compared with Examples 1 to 2. On the same ground, the number of times of the MIT test results was smaller as compared with Examples 1 and 2.

In Example 6, the percentage of the white region after the surface SEM image processing was larger as compared with Examples 1 and 2. This would result from the atmospheric heating employed, leading to a small extent of foaming, as well as a large domain, since the specimen was not heated evenly. On the same ground, the number of times of the MIT test results was smaller as compared with Examples 1 and 2.

To the contrary, in Comparative Examples 1 to 4, the percentage of the white region after the surface SEM image processing was smaller as compared with Examples 1 to 6. Additionally, in Comparative Example 5, the percentage of the white region after the surface SEM image processing was larger as compared with Examples 1 to 6.

In more detail, the percentage of the white region after the surface SEM image processing was smaller in Comparative Example 1 as compared with Examples on the ground that graphitization did not proceed enough due to the maximum temperature as low as 2,600° C., and that foaming failed since the temperature was not elevated to the temperature that allows the internal gas to be generated, and thus, a soft graphite film could not be obtained consequently.

The percentage of the white region after the surface SEM image processing was smaller in Comparative Examples 2 and 3 as compared with Examples on the ground that the number of the laminated pieces of the source material film in graphitization was small. This would result from small number of the laminated pieces, whereby the film was heated in an even manner excessively, the gas generation could not be retarded, and invasion of impurities could not be suppressed. As a result, a graphite film having a small extent of foaming, a too large domain, and being inferior in the flex resistance was obtained.

The percentage of the white region after the surface SEM image processing was smaller in Comparative Example 4 as compared with Examples on the ground that the load placed in graphitization was too heavy, whereby foaming of the film in the thickness direction was suppressed.

The percentage of the white region after the surface SEM image processing was larger in Comparative Example 5 as compared with Examples on the ground that the load placed in graphitization was too light, and thus, the growth of the graphite layers in the planer direction was insufficient, and the extent of foaming was too large.

Furthermore, the percentage of the white region after the surface SEM image processing was significantly greater in Reference Examples 1 to 2 as compared with Examples 1 to 5. The graphite film had a larger extent of foaming, and a smaller domain as compared with Examples 1 to 5, and therefore, the flex resistance was inferior to those in Examples 1 to 5.

<Measurement of Coefficient of Thermal Diffusivity>

The coefficient of thermal diffusivity was as high as not less than $8.3 \times 10^{-4}$ m$^2$/s, and extremely excellent flex resistance was exhibited in Examples 1 to 5. This would result from the extent of foaming of the graphite film controlled by the balance of the number of the laminated pieces and the weight, and uniform graphitization at a high temperature achieved with an electrification excessive heating method.

Since the graphite film of Example 6 was obtained by an atmospheric heating method, the coefficient of thermal diffusivity was lower to some extent as compared with Examples 1 to 5 due to failure in heating in an even manner.

To the contrary, the coefficient of thermal diffusivity was as low as $3.2 \times 10^{-4}$ m$^2$/s in Comparative Example 1 since the temperature was elevated to 2,600° C., due to insufficient progress of graphitization.

The coefficient of thermal diffusivity was prominent being not less than $9.8 \times 10^{-4}$ m$^2$/s in Comparative Examples 2 and 3, and this would result from the number of the laminated pieces of the source material film being small in graphitization. When the number of the laminated pieces is small, the film can be heated evenly, and invasion of impurities cannot be suppressed, thereby yielding a graphite film in which the graphite is extremely highly grown in the planer direction.

The coefficient of thermal diffusivity was prominent being not less than $10.3 \times 10^{-4}$ m$^2$/s in Comparative Example 4, and this would result from excessively high load placed in graphitization, whereby a film including graphite layers highly oriented in the planer direction was formed. The graphite films of Comparative Examples 2, 3 and 4 were hard and inferior in the flex resistance due to too small extent of foaming, with domains grown to larger, although the coefficient of thermal diffusivity was very high. The coefficient of thermal diffusivity of the graphite film of Reference Examples 1 to 2 were smaller as compared with Examples 1 to 5.

<MIT Folding Endurance Test of Composite>

MIT tests were performed on the composite with the PET tape, and the composite with the flexible print wiring plate. As a result, the composite with the PET tape exhibited more superior flex resistance than the composite with the flexible print wiring plate. This is presumed to result from the composite with the flexible print wiring plate having a greater thickness of the composite, being more rigid, and being more likely to be deteriorated due to different balance of the top and bottom faces of the graphite. However, since the composite with the PET tape and the composite with the flexible print wiring plate indicated a similar tendency, only the composite with the PET tape will be discussed in the following.

No alteration of the appearance was found even after flex of 50,000 times in Examples 1 to 5, which revealed superior flex resistance as compared with Comparative Examples 1 to 5, and Reference Examples 1 to 2. This would result from extremely excellent flex resistance of the simplicial graphite. To the contrary, according to Comparative Examples 1 to 5 and Reference Examples 1 to 2 in which the simplicial graphite film was inferior in the flex resistance, very inferior flex resistance was exhibited even though the film was reinforced with a support of the PET tape.

<Deterioration of Thermal Diffusivity Before and After Seam Folding>

With respect to deterioration of the thermal diffusivity after the seam folding, any deterioration of thermal diffusivity at 1° C. or higher was not observed when R is 0.5 in Examples 1 to 5 and Reference Example 1. To the contrary, the specimen was broken from the bent portion after seam folding of 10 times in Comparative Examples 1 to 5; therefore, evaluation of the thermal diffusivity could not be performed. In addition, deterioration of thermal diffusivity at 1.1° C. was confirmed in Reference Example 2.

Before and after seam folding under a stringent condition of R being 0.0, deterioration of the thermal diffusivity at 1° C. or higher was observed in Examples 4 to 6 and Reference Examples 1 to 2. In addition, the specimen was broken from the bent portion after seam folding of 10 times in Comparative Examples 1 to 5; therefore, evaluation of the thermal diffusivity could not be performed. To the contrary, deterioration of the thermal diffusivity was not found even under a stringent condition of R being 0.0 in Examples 1 to 3.

As in the foregoing, it is proven that the graphite film of the present invention has an excellent flex resistance which can withstand application to bent portions, along with an excellent thermal diffusivity that enables a heat to be quickly diffused from a site of heat generation. In addition, it is also proven that the graphite composite film produced using the graphite film of the present invention, exhibits an excellent flex resistance.

The invention claimed is:

1. A graphite film exhibiting the number of reciprocal foldings being 10,000 times or more as measured according to a folding endurance test with a rectangular strip test piece having a width of 15 mm until the test piece breaks under conditions of: a curvature radius R of a bending clamp being 2 mm; a left-and-right bending angle being 135 degrees; a bending rate being 90 times/min; and a load being 0.98 N.

2. The graphite film according to claim 1, said graphite film exhibiting the number of reciprocal foldings being 10,000 times or more as measured according to a folding endurance test with a rectangular strip test piece having a width of 15 mm until the test piece breaks under conditions of: a curvature radius R of the bending clamp being 1 mm; a left-and-right bending angle being 135 degrees; a bending rate being 90 times/min; and a load being 0.98 N.

3. The graphite film according to claim 1, wherein the graphite film has a coefficient of thermal diffusivity in a planer direction of not less than $8.0 \times 10^{-4}$ $m^2/s$.

4. A graphite composite film comprising a plastic film formed on the graphite film according to claim 1 via an adhesive material or an adhesive.

5. The graphite film according to claim 2, wherein the graphite film has a coefficient of thermal diffusivity in a planer direction of not less than $8.0 \times 10^{-4}$ $m^2/s$.

6. A graphite composite film comprising a plastic film formed on the graphite film according to claim 2 via an adhesive material or an adhesive.

7. A graphite composite film comprising a plastic film formed on the graphite film according to claim 3 via an adhesive material or an adhesive.

* * * * *